United States Patent
Kurihara et al.

(10) Patent No.: US 12,112,896 B2
(45) Date of Patent: Oct. 8, 2024

(54) FILM PRODUCTION METHOD AND ELECTRODE FOIL PRODUCTION METHOD FOR PRODUCING LAYER CONTAINING METAL OXIDE

(71) Applicant: Panasonic Intellectual Property Management Co., Ltd., Osaka (JP)

(72) Inventors: Naomi Kurihara, Osaka (JP); Akihiro Yamaguchi, Nara (JP); Mitsuhisa Yoshimura, Osaka (JP); Miwa Ogawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 364 days.

(21) Appl. No.: 17/426,039

(22) PCT Filed: Feb. 19, 2020

(86) PCT No.: PCT/JP2020/006465
§ 371 (c)(1),
(2) Date: Jul. 27, 2021

(87) PCT Pub. No.: WO2020/171114
PCT Pub. Date: Aug. 27, 2020

(65) Prior Publication Data
US 2022/0115185 A1     Apr. 14, 2022

(30) Foreign Application Priority Data
Feb. 20, 2019  (JP) .................. 2019-028526

(51) Int. Cl.
*C23C 16/40* (2006.01)
*C23C 16/02* (2006.01)
(Continued)

(52) U.S. Cl.
CPC ........ *H01G 9/0032* (2013.01); *C23C 16/0209* (2013.01); *C23C 16/40* (2013.01); *H01G 13/006* (2013.01); *H01G 9/055* (2013.01)

(58) Field of Classification Search
CPC ........ C23C 16/40; C23C 16/0209; H01G 9/00; H01G 9/055
See application file for complete search history.

(56) References Cited

U.S. PATENT DOCUMENTS

| | | | |
|---|---|---|---|
| 2007/0049051 A1 | 3/2007 | Ahn et al. | |
| 2010/0190029 A1* | 7/2010 | Ueki | B32B 27/32 |
| | | | 205/164 |

(Continued)

FOREIGN PATENT DOCUMENTS

| | | |
|---|---|---|
| CN | 101406108 A | 4/2009 |
| JP | 2005-537385 | 12/2005 |

(Continued)

OTHER PUBLICATIONS

Misumi, Satoshi, et al., "A nanometric Rh overlayer on a metal foil surface as a highly efficient three-way catalyst". Scientific Reports 6: 29737, pp. 1-8.*

(Continued)

*Primary Examiner* — Bret P Chen
(74) *Attorney, Agent, or Firm* — Rimon P.C.

(57) ABSTRACT

A film production method for producing a layer containing a metal oxide, the film production method including: a heating step of heating a metal foil containing a first metal by bringing a part of the metal foil into contact with at least one heat generator; a first contact step of letting first gas containing a second metal to be in contact with both surfaces of the metal foil in a state where the part of the metal foil is supported; and a second contact step of letting second gas containing an oxidant to be in contact with the both surfaces (Continued)

of the metal foil in a state where the part of the metal foil is supported.

39 Claims, 23 Drawing Sheets

(51) Int. Cl.
*H01G 9/00* (2006.01)
*H01G 13/00* (2013.01)
*H01G 9/055* (2006.01)

(56) References Cited

U.S. PATENT DOCUMENTS

| | | | |
|---|---|---|---|
| 2012/0219708 A1* | 8/2012 | Dickey | C23C 16/545 |
| | | | 118/719 |
| 2014/0178114 A1 | 6/2014 | Tamemasa et al. | |
| 2017/0104426 A1* | 4/2017 | Mills | H01L 31/0549 |
| 2018/0358181 A1 | 12/2018 | Ogawa et al. | |
| 2019/0261500 A1 | 8/2019 | Suzuki et al. | |
| 2021/0062318 A1* | 3/2021 | Frey | H01M 4/134 |

FOREIGN PATENT DOCUMENTS

| | | |
|---|---|---|
| JP | 2011-202235 | 10/2011 |
| JP | 2012-041582 | 3/2012 |
| JP | 2014-123036 A | 7/2014 |
| JP | 2016-103751 A | 6/2016 |
| JP | 2017-218611 | 12/2017 |
| JP | 2019-143233 | 8/2019 |
| WO | 2007112370 A1 | 10/2007 |
| WO | 2017/154461 | 9/2017 |
| WO | WO 2017/191682 A1 * | 9/2017 ............... A61F 7/03 |

OTHER PUBLICATIONS

Zhang, Huigang, et al., "Electroplating lithium transition metal oxides". Science Advances, 2017; 3: e1602427, May 12, 2017, pp. 1-8.*

Domingues, Sergio H., et al., "Reduction of graphene oxide films on Al foil for hybrid transparent conductive film applications". Carbon 63 (2013) 454-459.*

Teichert, S., et al., "An oxide-based thermoelectric generator: Transversal thermoelectric strip-device". AIP Advances, 5, 077105 (2015), pp. 1-6.*

Tappura, Kirsi, et al., "Large-area implementation and critical evaluation of the material and fabrication aspects of a thin-film thermoelectric generator based on aluminum-doped zinc oxide". Renewable Energy, 147 (2020) 1292-1298.*

English Translation of Chinese Office Action dated Dec. 14, 2022 for the related Chinese Patent Application No. 202080015119.X.

International Search Report of PCT application No. PCT/JP2020/006465 dated Apr. 14, 2020.

* cited by examiner (II-i)

FILM PRODUCTION METHOD AND ELECTRODE FOIL PRODUCTION METHOD FOR PRODUCING LAYER CONTAINING METAL OXIDE

CROSS-REFERENCE TO RELATED APPLICATIONS

This application is a U.S. national stage application of the PCT International Application No. PCT/JP2020/006465 filed on Feb. 19, 2020, which claims the benefit of foreign priority of Japanese patent application No. 2019-028526 filed on Feb. 20, 2019, the contents all of which are incorporated herein by reference.

TECHNICAL FIELD

The present invention relates to a film production method, a film production device, and an electrode foil production method using an atomic layer deposition method, and relates to a method and a device for forming a layer (dielectric layer) containing a metal oxide on both surfaces of a metal foil.

BACKGROUND

A metal oxide (dielectric) layer is formed on a surface of a metal foil used as an electrode foil of an electrolytic capacitor. International Publication WO2017/154461 teaches forming a dielectric layer on a main surface of a metal foil by an atomic layer deposition method (ALD method).

SUMMARY

Technical Problem

A dielectric layer is typically formed on both main surfaces of a metal foil. From the viewpoint of productivity, it is required to efficiently form a dielectric layer on both main surfaces of a metal foil.

Solution to Problem

A first aspect of the present invention relates to a film production method for producing a layer containing a metal oxide. The film production method includes: a heating step of heating a metal foil containing a first metal by bringing a part of the metal foil into contact with at least one heat generator; a first contact step of letting first gas containing a second metal to be in contact with both surfaces of the metal foil in a state where the part of the metal foil is supported; and a second contact step of letting second gas containing an oxidant to be in contact with the both surfaces of the metal foil in a state where the part of the metal foil is supported.

A second aspect of the present invention relates to a film production device. The film production device includes: at least one chamber; a pressure controller that controls a pressure in the at least one chamber to be a reduced pressure atmosphere; a first supply port through which first gas containing a second metal is supplied to the at least one chamber; a second supply port through which second gas containing an oxidant is supplied to the at least one chamber; a first exhaust port through which the first gas is discharged from the at least one chamber; a second exhaust port through which the second gas is discharged from the at least one chamber; and at least one heat generator that is disposed in the at least one chamber and heats a metal foil by making contact with a part of the metal foil, the metal foil being an object on which a film is to be formed. The first gas and the second gas are supplied to be in contact with both main surfaces of the metal foil.

A third aspect of the present invention relates to a method for producing an electrode foil. The method includes: a preparation step of preparing a metal foil containing a first metal; a surface roughening step of roughening both main surfaces of the metal foil; a heating step of heating the metal foil that has been roughened by bringing a part of the metal foil into contact with at least one heat generator; a first contact step of letting first gas containing a second metal to be in contact with the both main surfaces of the metal foil in a state where the part of the metal foil is supported; and a second contact step of forming a dielectric layer by letting second gas containing an oxidant to be in contact with the both main surfaces of the metal foil in a state where the part of the metal foil is supported.

A fourth aspect of the present invention relates to a film production method for producing a layer containing a metal oxide. The film production method includes: a first contact step of letting first gas containing a second metal to be in contact with both surfaces of a metal foil containing a first metal; a second contact step of letting second gas containing an oxidant to be in contact with the both surfaces of the metal foil; and a first application step of applying a voltage to the metal foil in presence of the first gas by bringing a part of the metal foil into contact with at least one first power feeder.

A fifth aspect of the present invention relates to a method for producing an electrode foil. The method includes: a preparation step of preparing a metal foil containing a first metal; a surface roughening step of roughening both main surfaces of the metal foil; a first contact step of letting first gas containing a second metal to be in contact with the both main surfaces of the metal foil that have been roughened; a second contact step of bringing second gas containing an oxidant into contact with the both main surfaces of the metal foil; and a first application step of applying a voltage to the metal foil in presence of the first gas by bringing a part of the metal foil into contact with at least one first power feeder.

A sixth aspect of the present invention relates to a film production method for producing a layer containing a metal oxide. The film production method includes: a first contact step of letting first gas containing a second metal to be in contact with both surfaces of a metal foil containing a first metal; a second contact step of letting second gas containing an oxidant to be in contact with the both surfaces of the metal foil; and an application step of applying a voltage to the metal foil in presence of the second gas by bringing a part of the metal foil into contact with at least one power feeder.

A seventh aspect of the present invention relates to a method for producing an electrode foil. The method includes: a preparation step of preparing a metal foil containing a first metal; a surface roughening step of roughening both main surfaces of the metal foil; a first contact step of letting first gas containing a second metal to be in contact with the both main surfaces of the metal foil that have been roughened; a second contact step of letting second gas containing an oxidant to be in contact with the both main surfaces of the metal foil; and a second application step of applying a voltage to the metal foil in presence of the second gas by bringing a part of the metal foil into contact with at least one second power feeder.

An eighth aspect of the present invention relates to a film production device. The film production device includes: at least one chamber; a pressure controller that controls a pressure in the at least one chamber to be a reduced pressure atmosphere; a first supply port through which first gas containing a second metal is supplied to the at least one chamber; a second supply port through which second gas containing an oxidant is supplied to the at least one chamber; a first exhaust port through which the first gas is discharged from the at least one chamber; a second exhaust port through which the second gas is discharged from the at least one chamber; at least one power feeder that makes contact with a part of a metal foil, the metal foil being an object on which a film is to be formed; and a counter electrode that generates a voltage difference between the metal foil and the at least one power feeder. The first gas and the second gas are supplied to be in contact with both main surfaces of the metal foil.

A ninth aspect of the present invention relates to a film production method for producing a layer containing a metal oxide. The film production method includes: a heating step of heating a metal foil containing a first metal by bringing a part of the metal foil into contact with at least one heat generator; a first contact step of letting first gas containing a second metal to be in contact with both surfaces of the metal foil in a state where the part of the metal foil is supported; a second contact step of letting second gas containing an oxidant to be in contact with the both surfaces of the metal foil in a state where the part of the metal foil is supported; and an application step of applying a voltage to the metal foil in presence of at least one of the first gas or the second gas by bringing a part of the metal foil into contact with at least one power feeder.

Advantageous Effect of Invention

According to the present invention, a dielectric layer can be efficiently formed on both main surfaces of a metal foil by using an atomic layer deposition method.

DESCRIPTION OF EMBODIMENTS

Figure 1:
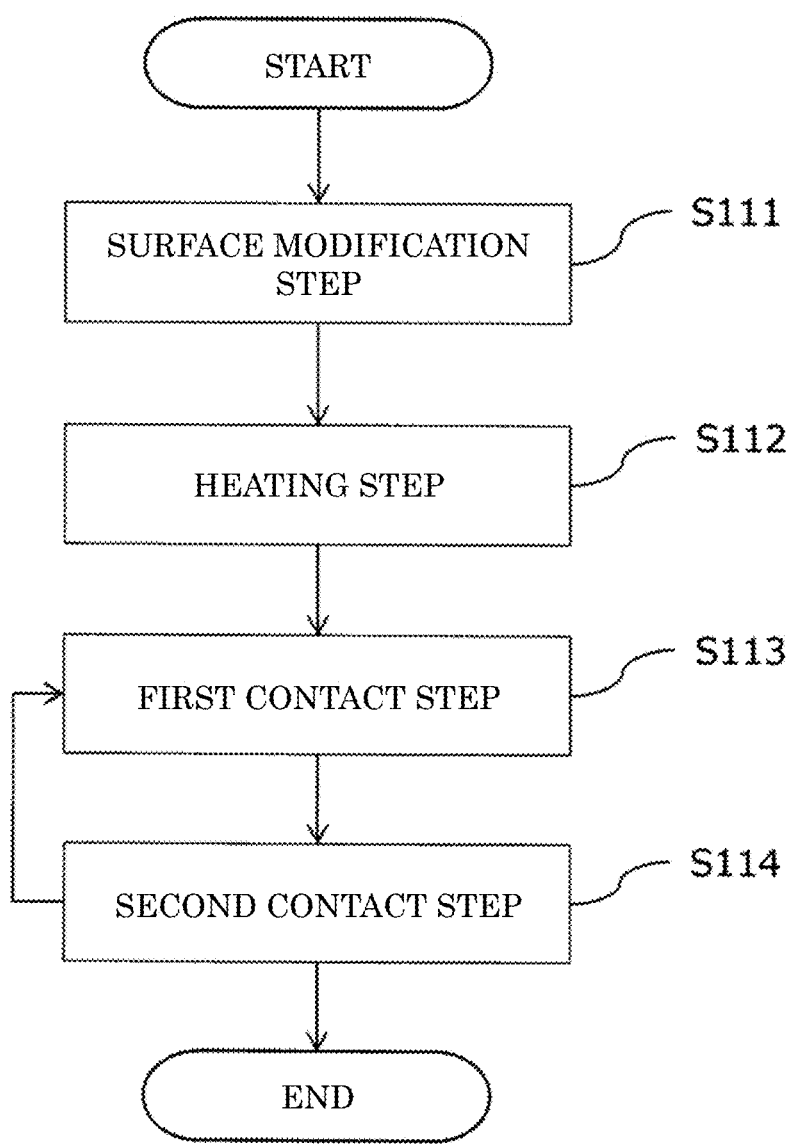
FIG. 1 is a flowchart illustrating a film production method according to a first aspect of the present invention.

In the present exemplary embodiment, an object on which a dielectric layer is to be formed is a metal foil. A metal foil has higher heat resistance, thermal conductivity, and electric conductivity than a resin film or the like, and further has a certain degree of rigidity. In the present exemplary embodiment, a layer (dielectric layer) containing a metal oxide is simultaneously formed on both main surfaces of a metal foil by utilizing such properties of the metal foil.

A film production method according to a first aspect includes: a heating step of heating a metal foil containing a first metal by bringing a part of the metal foil into contact with at least one heat generator; a first contact step of letting first gas containing a second metal to be in contact with both surfaces of the metal foil in a state where the part of the metal foil is supported; and a second contact step of letting second gas containing an oxidizing agent to be in contact with the both surfaces of the metal foil in a state where the part of the metal foil is supported.

The film production method according to the first aspect is performed by using the following film production device. The present exemplary embodiment encompasses this film production device.

That is, a film production device according to the first aspect includes at least one chamber, a pressure controller that controls a pressure in the at least one chamber to be a reduced pressure atmosphere, a first supply port through which first gas containing a second metal is supplied to the at least one chamber, a second supply port through which second gas containing an oxidant is supplied to the at least one chamber, a first exhaust port through which the first gas is discharged from the at least one chamber, a second exhaust port through which the second gas is discharged from the at least one chamber, and at least one heat generator that is disposed in the at least one chamber and heats a metal foil by making contact with a part of the metal foil, the metal foil being an object on which a film is to be formed. The first gas and the second gas are supplied to be in contact with both main surfaces of the metal foil.

An electrode foil of an electrolytic capacitor can be produced by using the film production device and/or the film production method according to the first aspect. The present exemplary embodiment encompasses a method for producing this electrode foil.

That is, a method for producing an electrode foil according to the first aspect includes: a preparation step of preparing a metal foil containing a first metal; a surface roughening step of roughening both main surfaces of the metal foil; a heating step of heating the metal foil that has been roughened by bringing a part of the metal foil into contact with at least one heat generator; a first contact step of letting first gas containing a second metal to be in contact with the both main surfaces of the metal foil in a state where the part of the metal foil is supported; and a second contact step of forming a dielectric layer by letting second gas containing an oxidant to be in contact with the both main surfaces of the metal foil in a state where the part of the metal foil is supported.

A film production method according to a second aspect includes: a first contact step of letting first gas containing a second metal to be in contact with both surfaces of a metal foil containing a first metal; a second contact step of letting second gas containing an oxidant to be in contact with the both surfaces of the metal foil; and a first application step of applying a voltage to the metal foil in the presence of the first gas by bringing a part of the metal foil into contact with at least one first power feeder.

An electrode foil of an electrolytic capacitor can be produced by using the film production method according to the second aspect. The present exemplary embodiment encompasses a method for producing this electrode foil.

That is, a method for producing an electrode foil according to the second aspect includes: a preparation step of preparing a metal foil containing a first metal; a surface roughening step of roughening both main surfaces of the metal foil; a first contact step of letting first gas containing a second metal to be in contact with the both main surfaces of the metal foil that have been roughened; a second contact step of letting second gas containing an oxidant to be in contact with the both main surfaces of the metal foil; and a first application step of applying a voltage to the metal foil in the presence of the first gas by bringing a part of the metal foil into contact with at least one first power feeder.

A film production method according to a third aspect includes: a first contact step of letting first gas containing a second metal to be in contact with both surfaces of a metal foil containing a first metal; a second contact step of letting second gas containing an oxidant to be in contact with the both surfaces of the metal foil; and an application step of applying a voltage to the metal foil in presence of the second gas by bringing a part of the metal foil into contact with at least one power feeder.

An electrode foil of an electrolytic capacitor can be produced by using the film production method according to the third aspect. The present exemplary embodiment encompasses a method for producing this electrode foil.

That is, a method for producing an electrode foil according to the third aspect includes: a preparation step of preparing a metal foil containing a first metal; a roughening step of roughening both main surfaces of the metal foil; a first contact step of letting first gas containing a second metal to be in contact with the both main surfaces of the metal foil; a second contact step of letting second gas containing an oxidant to be in contact with the both main surfaces of the metal foil; and a second application step of applying a voltage to the metal foil in presence of the second gas by bringing a part of the metal foil into contact with at least one second power feeder.

The film production method according to the second aspect and the third aspect is performed by using the following film production device. The present exemplary embodiment encompasses this film production device.

That is, a film production device according to the second aspect and the third aspect includes at least one chamber, a pressure controller that controls a pressure in the at least one chamber to be a reduced pressure atmosphere, a first supply port through which first gas containing a second metal is supplied to the at least one chamber, a second supply port through which second gas containing an oxidant is supplied to the at least one chamber, a first exhaust port through which the first gas is discharged from the at least one chamber, a second exhaust port through which the second gas is discharged from the at least one chamber, at least one power feeder that make-makes contact with a part of the metal foil, the metal foil being an object on which a film is to be formed, and a counter electrode that generates a voltage difference between the metal foil and the at least one power feeder. The first gas and the second gas are supplied to be in contact with both main surfaces of the metal foil.

A film formation method according to a fourth aspect includes: a heating step of heating a metal foil containing a first metal by bringing a part of the metal foil into contact with at least one heat generator; a first contact step of letting first gas containing a second metal to be in contact with both surfaces of the metal foil in a state where the part of the metal foil is supported; a second contact step of letting second gas containing an oxidant to be in contact with the both surfaces of the metal foil in a state where the part of the metal foil is supported; and an application step of applying a voltage to the metal foil in presence of at least one of the first gas or the second gas by bringing a part of the metal foil into contact with at least one power feeder.

I. First Aspect

In the present aspect, a metal foil is heated. The heat enhances a reaction of an oxidant and/or molecules including a second metal with a surface of the metal foil. Thus, a uniform dielectric layer is formed.

[Film Production Method]

A film production method according to the first aspect includes a heating step of heating a metal foil. FIG. 1 is a flowchart illustrating a film production method according to the first aspect.

(Metal Foil)

The metal foil contains a first metal. The kind of the first metal is not limited in particular. The first metal may be a valve metal such as aluminum (Al), tantalum (Ta), or niobium (Nb) or an alloy containing the valve metal from the viewpoint of easy formation of a dielectric layer. A thickness of the metal foil is not limited in particular, and may be, for example, 10 μm or more and 300 μm or less or may be, for example, 15 μm or more and 250 μm or less. Purity of the metal foil is not limited in particular. The purity of the metal foil may be, for example, 99% or more and 99.99% or less.

A surface of the metal foil may be roughened. Further, another dielectric layer may be formed on the surface of the metal foil. For example, the metal foil may have another dielectric layer formed inside a pit formed by roughening. The other dielectric film is formed, for example, by anodization.

(i) Surface Modification Step (S111)

Before a first contact step, preferably before the heating step, surface modification treatment for modifying the surface of the metal foil may be performed. The surface modification treatment is performed to remove impurities on the surface of the metal foil and modify a surface state of the metal foil. This improves uniformity, adhesion, and denseness of a film to be formed, an effect of preventing diffusion of metal atoms of the metal foil, and an insulating property, and further improves characteristics such as leakage current and electrostatic capacitance. In particular, in a case where a withstand voltage of the obtained electrode foil is 200V or less, further in a case where the withstand voltage is 50V or less, the effect of the surface modification step is easily obtained.

The surface modification treatment is not limited in particular, and is, for example, plasma treatment or atmospheric pressure plasma treatment. The surface modification treatment may be performed in the atmosphere or may be performed under reduced pressure. The surface modification, for example, adds a hydroxyl group to the surface of the metal foil or decomposes or vaporize impurities such as organic substances.

(ii) Heating Step (S112)

In the heating step, the metal foil is brought into contact with a heat generator. Since the metal foil generally has high heat resistance, a method of heating by contact can be applied. Since the atomic layer deposition (ALD) method is performed in a reduced-pressure atmosphere, heat propagation by convection cannot be expected much. Hence, the method of the present exemplary embodiment capable of heating the metal foil by using heat conduction is suitable for the ALD method. A part of the metal foil is brought into contact with the heat generator. Since the metal foil has high thermal conductivity, an entirety of the metal foil can be quickly heated by bringing the part of the metal foil into contact with the heat generator.

During heating, the metal foil may be pressed toward the heat generator by a pressing member disposed at a position corresponding to the heat generator. As a result, the metal foil and the heat generator are brought into close contact with each other, and the metal foil is efficiently heated. Similarly to the heat generator, the pressing member is brought into contact with the part of the metal foil. The pressing member may be a heat generator. By bringing the heat generator into contact with both main surfaces of the metal foil, heating efficiency is further improved.

A heating temperature is not limited in particular, and may be appropriately set in accordance with conditions of the method for forming the dielectric layer (atomic layer deposition method). The heating temperature is, for example, 80° C. or more and 550° C. or less.

In a case where the metal foil contains aluminum, the heating temperature is preferably 90° C. or more and 525° C. or less. In a case where the heating temperature is in this range, the effect of heating is easily obtained, and deformation of the metal foil is easily suppressed. In particular, in a case where the metal foil is conveyed by roll-to-roll, stress is applied to the metal foil by a roller or the like, and deformation or plastic deformation of pits easily occurs. Deformation of the metal foil makes conveyance unstable and tends to make a produced film uneven.

In a case where the metal foil contains aluminum, the heating temperature is particularly preferably 90° C. or more and 480° C. or less. In a case where the heating temperature is in this range, deformation or plastic deformation of the pit shape can be further reduced.

(iii) First Contact Step (S113)

The heated metal foil is brought into contact with first gas containing the second metal in a state where a part of the metal foil is supported. This can bring the first gas into contact with both main surfaces (both surfaces) of the metal foil. Molecules including the second metal contained in the first gas adhere to both surfaces of the metal foil.

Examples of the second metal include Al, Ta, Nb, silicon (Si), titanium (Ti), zirconium (Zr), and hafnium (Hf). These may be used alone or in combination of two or more kinds thereof. That is, the dielectric layer may contain $Al_2O_3$, $Ta_2O_5$, $Nb_2O_5$, $SiO_2$, $TiO_2$, $ZrO_2$, or $HfO_2$ alone or in combination of two or more kinds thereof. In a case where the dielectric layer contains two or more kinds of oxides of the second metal, the oxides may be mixed or may be arranged in layers. Above all, the second metal is preferably a metal species different from a first metal contained in the metal foil. In particular, the oxide of the second metal preferably has a relative dielectric constant higher than that of the oxide of the first metal from the viewpoint of increasing capacitance of the obtained electrolytic capacitor. From the viewpoint of improving the withstand voltage of the electrolytic capacitor, the oxide of the second metal is preferably $Ta_2O_5$, $SiO_2$, $ZrO_2$, or $HfO_2$.

The first gas contains a precursor containing the second metal in a gaseous state. The first gas may contain a plurality of kinds of precursors. Different types of precursors may be simultaneously or sequentially supplied to a chamber. Alternatively, the kind of precursor contained in the first gas may be changed for each cycle.

The precursor is an organometallic compound including the second metal, and thus the second metal is easily chemically adsorbed to the object. As the precursor, various organometallic compounds conventionally used in the ALD method can be used.

Examples of the precursor containing Ti include bis(t-butylcyclopentadienyl)titanium(IV) dichloride ($C_{18}H_{26}C_{12}Ti$), tetrakis(dimethylamino)titanium(IV) ($[(CH_3)_2N]_4Ti$, TDMAT), tetrakis(diethylamino)titanium (IV) ($[(C_2H_5)_2N]_4Ti$), tetrakis(ethylmethylamino)titanium (IV) ($Ti[N(C_2H_5)(CH_3)]_4$), titanium(IV)(diisopropoxide-bis (2,2,6,6-tetramethyl-3,5-heptane dionate ($Ti[OCC(CH_3)_3CHCOC(CH_3)_3]_2(OC_3H_7)_2$), titanium tetrachloride ($TiCl_4$), titanium(IV) isopropoxide ($Ti[OCH(CH_3)_2]_4$), and titanium(IV) ethoxide ($Ti[O(C_2H_5)]_4$).

Examples of the precursor containing Al include trimethylaluminum (($CH_3)_3Al$). Examples of the precursor containing Zr include bis(methyl-η5-cyclopentadienyl)methoxymethylzirconium ($Zr(CH_3C_5H_4)_2CH_3OCH_3$), tetrakis (dimethylamide)zirconium(IV) ($[(CH_3)_2N]_4Zr$), tetrakis (ethylmethylamide)zirconium(IV) (Zr(NCH$_3$C$_2$H$_5$)$_4$), and zirconium(IV)t-butoxide (Zr[OC(CH$_3$)$_3$]$_4$). Examples of the precursor containing Nb include niobium(V)ethoxide (Nb(OCH$_2$CH$_3$)$_5$) and tris(diethylamide)(t-butylimide)niobium (V) (C$_{16}$H$_{39}$N$_4$Nb).

Examples of the precursor containing Si include N-sec-butyl(trimethylsilyl)amine (C$_7$H$_{19}$NSi), 1,3-diethyl-1,1,3,3-tetramethyldisilazane (C$_8$H$_{23}$NSi$_2$), 2,4,6,8,10-pentamethyl-cyclopentasiloxane ((CH$_3$SiHO)$_5$), pentamethyldisilane ((CH$_3$)$_3$SiSi(CH$_3$)$_2$H), tris(isopropoxy)silanol ([(H$_3$C)$_2$CHO]$_3$SiOH), chloropentamethyldisilane ((CH$_3$)$_3$SiSi(CH$_3$)$_2$Cl), dichlorosilane (SiH$_2$Cl$_2$), tridimethylaminosilane (Si[N(CH$_3$)$_2$]$_4$), tetraethylsilane (Si(C$_2$H$_5$)$_4$), tetramethylsilane (Si(CH$_3$)$_4$), tetraethoxysilane (Si(OC$_2$H$_5$)$_4$), dodecamethylcyclohexasilane ((Si(CH$_3$)$_2$)$_6$), silicon tetrachloride (SiCl$_4$), and silicon tetrabromide (SiBr$_4$).

Examples of the precursor containing Ta include tris(ethylmethylamide)(t-butylamide)tantalum(V) (C$_{13}$H$_{33}$N$_4$Ta), tantalum(V) pentaethoxide (Ta(OC$_2$H$_5$)$_5$), tris(diethylamide)(t-butylimide)tantalum(V) ((CH$_3$)$_3$CNTa(N(C$_2$H$_5$)$_2$)$_3$), and pentakis(dimethylamino)tantalum(V) (Ta(N(CH$_3$)$_2$)$_5$).

Examples of the precursor containing Hf include hafnium tetrachloride (HfCl$_4$), tetrakis dimethylamino hafnium (Hf[N(CH$_3$)$_2$]$_4$), tetrakis ethylmethylamino hafnium (Hf[N(C$_2$H$_5$)(CH$_3$)]$_4$), tetrakis diethylamino hafnium (Hf[N(C$_2$H$_5$)$_2$]$_4$), and hafnium-t-butoxide (Hf[OC(CH$_3$)$_3$]$_4$).

(iv) Second Contact Step (S114)

After the first gas is exhausted (purged), second gas is brought into contact with the metal foil. Also in this case, a part of the metal foil is supported. Hence, the second gas can be brought into contact with both surfaces of the metal foil. Molecules including the second metal adhering to both surfaces of the metal foil react with an oxidant contained in the second gas to form an oxide of the second metal. As a result, a dielectric layer containing an oxide of the second metal is formed on both surfaces of the metal foil without performing an operation of switching the upper and lower surfaces of the metal foil.

The second gas contains an inert gas and an oxidant. As the inert gas, an inert gas conventionally used in the ALD method can be used. The inert gas is, for example, nitrogen or argon.

As the oxidant, an oxidant conventionally used in the ALD method can be used. Examples of the oxidant include water, oxygen, ozone, hydrogen peroxide, and carbon dioxide. The oxidant may be supplied to a reaction chamber as plasma made of the oxidant.

The order of the steps is not limited in particular. Typically, the second gas is brought into contact with the metal foil after the first gas is brought into contact with the metal foil. The first contact step may be performed while heating the metal foil. The second contact step may be performed while heating the metal foil.

The first contact step and the second contact step may be repeatedly performed a plurality of times. Specifically, in the chamber, supply (pulse) of the first gas→exhaust (purge) of the first gas→supply (pulse) of the second gas→exhaust (purge) of the second gas may be repeated. The kind of the first gas and/or the second gas may be changed for each cycle. After the dielectric layer is formed by the first gas and the second gas, a dielectric layer may be further formed by another first gas and another second gas.

In the ALD method, since a self-limiting action is exhibited, the second metal is deposited on the surface of the object in units of atomic layers. Hence, the thickness of the dielectric layer is controlled by a number of cycles each made up of the first contact step and the second contact step. The thickness of the dielectric layer is not limited in particular, and may be, for example, 0.5 nm or more and 200 nm or less.

The heating step and the first contact step and/or the second contact step are preferably performed in a space of the same chamber. The same chamber does not include, for example, a case where two chambers connected through a port physically blocked at 80% or more by a wall. In this case, the metal foil can be quickly brought into contact with the first gas after being heated, and thus the oxidant and/or the molecules including the second metal that are contained in the first gas easily adhere to the metal foil, and film formation proceeds more efficiently.

[Method for Producing Electrode Foil]

A method for manufacturing an electrode foil according to the first aspect includes a heating step of heating a metal foil while bringing a part of the metal foil into contact with at least one heat generator.

In the film production method and the method for producing an electrode foil according to the first aspect, both a metal foil having a predetermined size and a long metal foil are objects on which a film is to be formed. The electrode foil produced by the above method is suitably used as an anode body of an electrolytic capacitor.

Figure 2:
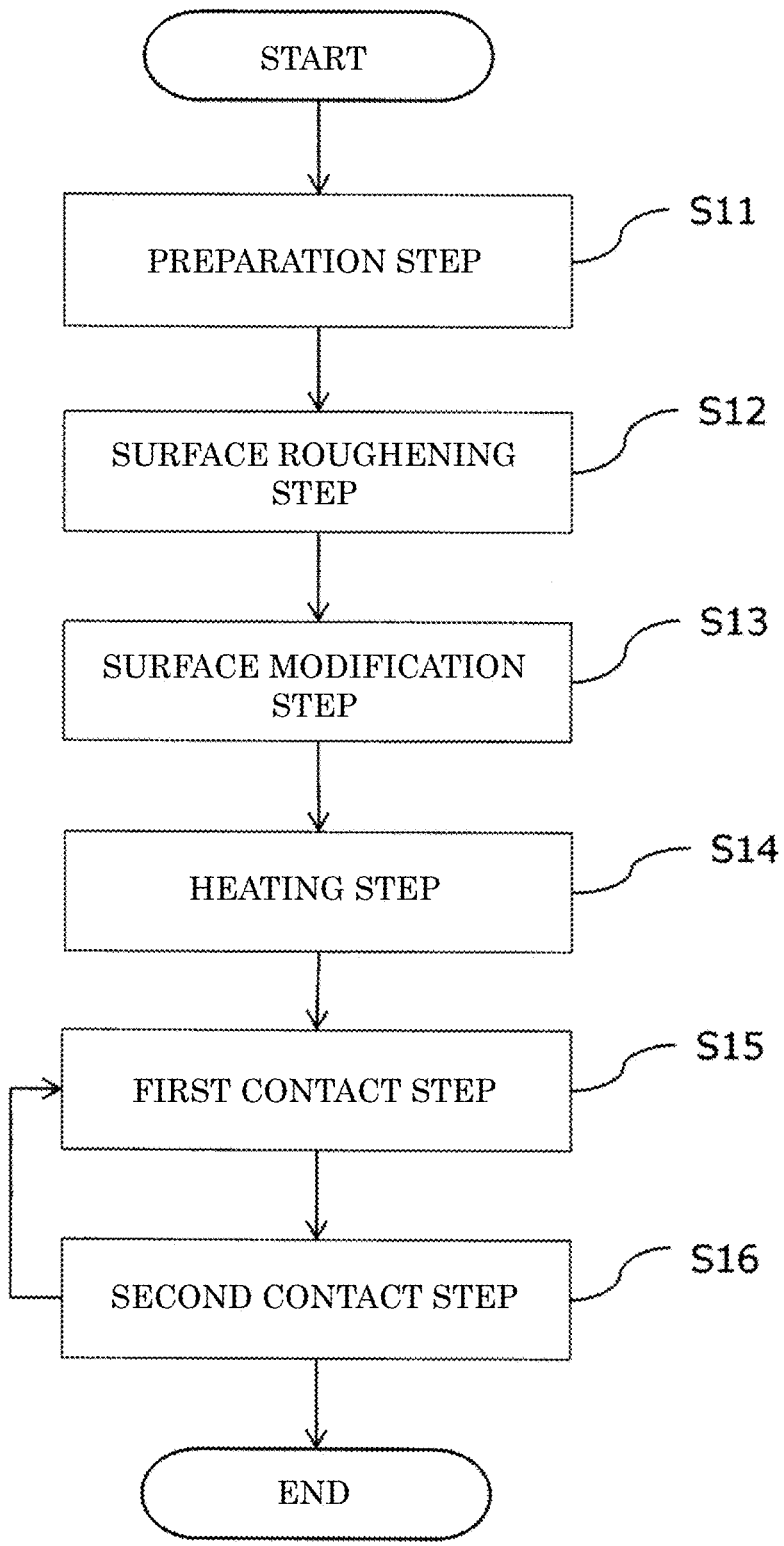
FIG. 2 is a flowchart illustrating a method for producing an electrode foil according to the first aspect of the present invention.

Hereinafter, the method for producing an electrode foil according to the first aspect will be described in detail for each step. FIG. 2 is a flowchart illustrating a method for manufacturing an electrode foil according to the first aspect.

(1) Preparation Step (S11)

A metal foil similar to that described in the film production method according to the first aspect is prepared. The metal foil may have another dielectric layer formed inside pits formed by roughening.

(2) Surface Roughening Step (S12)

A surface of the metal foil may be roughened before heating the metal foil. A plurality of pits are formed on the surface of the metal foil by roughening. A dielectric layer is formed to insides of the pits in a subsequent process, and thus an increase in capacitance can be expected. Meanwhile, in a case where the surface of the metal foil is roughened as described above, it is usually difficult to form a dielectric layer to the insides of the pits by a method other than anodization. By performing the heat treatment as in the present aspect, it is easy to form a uniform dielectric layer to the insides of the pits. This step is preferably performed in a case where a dielectric layer containing an oxide of the second metal is formed and then a third dielectric layer described later is formed by anodization. In a case where the third dielectric layer is a porous structure, this step may be omitted.

The roughening is performed, for example, by etching the metal foil. The etching treatment is preferably performed by an electrolytic etching method. The electrolytic etching is performed by flowing a direct current or an alternating current through the metal foil. The electrolytic etching is performed, for example, in an aqueous hydrochloric acid solution.

A pore diameter of the pits formed on the surface of the metal foil is not limited in particular. The pore diameter of the pits is preferably 50 nm or more and 2000 nm or less from the viewpoint of easily increasing a surface area. It is preferable that the pore diameter of the pits is not excessively large from the viewpoint of a contact property between the metal foil and the heat generator, a conveying roll, or the like. The pore diameter of the pits is more preferably 80 nm or more and 1300 nm or less. The pore diameter of the pits is, for example, a most frequent pore diameter of a pore distribution measured by a mercury porosimeter (the same applies hereinafter).

A thickness of an etched layer formed by the plurality of pits is not limited in particular, and may be set as appropriate according to the thickness of the metal foil. In a case where the metal foil is used as an anode of an electrolytic capacitor, the thickness of the etched layer is preferably 5 μm or more, more preferably 15 μm or more, from the viewpoint of capacitance. In a case where the thickness of the etched layer is in this range, the effect of heating is easily obtained. From the viewpoint of strength of the metal foil, the thickness of the etched layer is preferably 100 μm or less, more preferably 80 μm or less. The thickness of the etched layer is a thickness of an etched layer formed on one main surface of the metal foil. The thickness of the etched layer is an average of thicknesses at ten arbitrary points in an SEM or a transmission electron microscope (TEM) image of a cross section of the metal foil. The thickness of the dielectric layer is also calculated in the same manner (the same applies hereinafter).

Figure 3:
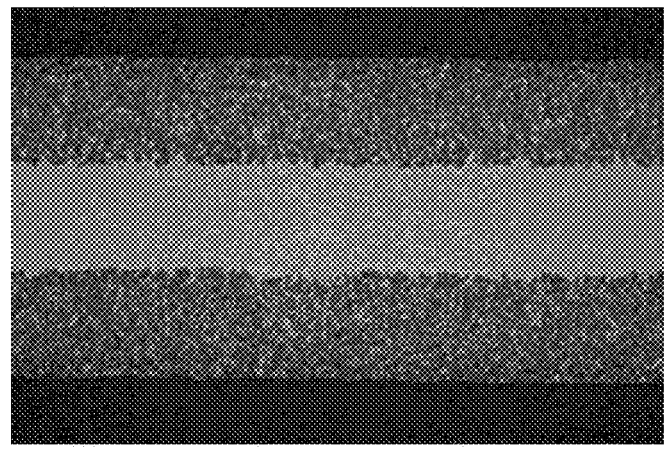
FIG. 3 is a scanning electron microscope (SEM) image (magnification: 300) showing a cross section of a roughened metal foil according to an exemplary embodiment of the present invention.

FIG. 3 is an SEM image (magnification: 300) of a cross section of the roughened metal foil according to the present exemplary embodiment. In FIG. 3, a region indicated by light gray in the central portion is a core portion having a lower porosity. The core portion is a non-etched region of the metal foil. An area adjacent to the core portion and indicated by dark gray is an etched layer. The etched layer is formed on both main surface sides of the metal foil. A portion outside the etched layer indicated by black is background.

(3) Surface Modification Step (S13)

Before a first contact step, preferably before the heating step, surface modification treatment for modifying the surface of the metal foil may be performed. The surface modification step is performed in a manner similar to (i) the surface modification step in the film production method according to the first aspect.

(4) Heating Step (S14)

The metal foil is heated in a manner similar to (ii) the heating step in the film production method according to the first aspect.

The metal foil is heated by bringing a heat generator into contact with a part of the metal foil. The metal foil is preferably heated in a chamber to which the first gas is supplied. During heating, an inside of the chamber may be depressurized.

(5) First Contact Step (S15) and Second Contact Step (S16)

The first gas and the second gas are respectively brought into contact with both surfaces of the metal foil by using the film production device described above. Each contact step is performed in a manner similar to (iii) the first contact step and (iv) the second contact step in the film production method according to the first aspect. As a result, a dielectric layer containing an oxide of the second metal is formed on both surfaces of the metal foil.

After the dielectric layer is formed, the metal foil may be chemically converted. As a result, the third dielectric layer containing an oxide of the first metal constituting the metal foil is formed between the metal foil and the dielectric layer. Hence, a layer having a uniform thickness without pinholes is easily formed as an entirety of the dielectric layer. A method for chemically converting the metal foil is not limited in particular. The chemical conversion is performed, for example, by immersing the metal foil in a chemically converting solution and applying a voltage (anodization).

[Film Production Device]

A film production device according to the first aspect includes a heat generator that is disposed in a chamber and heats a metal foil on which a film is to be formed while making contact with a part of the metal foil. The first gas and the second gas are supplied to be in contact with both main surfaces of the metal foil.

(Heat Generator)

The heat generator heats a metal foil on which a film is to be formed while making contact with a part of the metal foil. A number of heat generators may be one, two, or more. The shape of the heat generator is not limited in particular as long as a certain contact area is obtained between the heat generator and the metal foil. The heat generator may be, for example, a stage that supports the metal foil, a conveying roll, or a positioning member that positions the metal foil.

(Chamber)

The film production device includes at least one chamber.

The film production device may include one chamber capable of supplying and exhausting the first gas and the second gas.

The film production device may include a plurality of chambers capable of supplying and exhausting the first gas and the second gas. In this case, in the plurality of chambers, the same kind of first gas may be supplied. Alternatively, a plurality of kinds of first gases containing different second metals may be respectively supplied to the plurality of chambers. In the plurality of chambers, the same kind of second gas may be supplied. Alternatively, a plurality of kinds of second gases containing different oxidants may be respectively supplied to the plurality of chambers. It is only necessary that the heat generator be disposed in at least one of the plurality of chambers.

The film production device may include a first chamber capable of supplying and exhausting the first gas, and a second chamber capable of supplying and exhausting the second gas. It is only necessary that the heat generator be disposed in at least one of these chambers. Preferably, the heat generator is disposed in the first chamber.

The film production device may include a plurality of first chambers described above and/or a plurality of second chambers described above. In this case, in the plurality of first chambers, the same kind of first gas may be supplied or a plurality of kinds of first gases containing different second metals may be supplied. In the plurality of second chambers, the same kind of second gas may be supplied or a plurality of kinds of second gases containing different oxidants may be supplied. It is only necessary that the heat generator be disposed in at least one of the plurality of chambers. Preferably, the heat generator is disposed in at least one of the first chambers.

From the viewpoint of productivity, the film production device preferably includes at least one chamber capable of supplying and exhausting the first gas and the second gas. This makes the formation of at least one dielectric layer be completed in one chamber.

(Pressure Controller)

The chamber includes a pressure controller. A pressure in the chamber is controlled by the pressure controller so as to be a reduced pressure atmosphere. The pressure controller includes, for example, a computer.

(Supply Port and Exhaust Port)

The chamber includes a first supply port for supplying the first gas into the chamber and a first exhaust port for discharging the first gas. The chamber includes a second supply port for supplying the second gas into the chamber and a second exhaust port for discharging the second gas. The first gas and the second gas may be supplied from the same supply port. The first gas and the second gas may be discharged from the same exhaust port.

(Support)

In addition to the heat generator, the chamber may include a support that supports the metal foil while making contact with a part of the metal foil. A number of the supports may be one, two, or more. A shape of the support is not limited in particular as long as the support can stably support the metal foil. The support may be, for example, a stage that supports the metal foil, a conveying roll, or a positioning member that positions the metal foil.

(Pressing Member)

The chamber may further include a pressing member disposed at a position corresponding to the heat generator and configured to press the metal foil toward the heat generator. As a result, the metal foil and the heat generator are brought into close contact with each other, and the metal foil is efficiently heated. Similarly to the heat generator, the pressing member is brought into contact with a part of the metal foil. The pressing member may be a heat generator. By bringing the heat generator into contact with both main surfaces of the metal foil, heating efficiency is further improved.

In the film production method and the film production device according to the first aspect, a metal foil having a predetermined size can be an object on which a film is to be formed or a long metal foil can be an object on which a film is to be formed. The long metal foil is conveyed, for example, in a chamber, and a dielectric layer is continuously formed on the conveyed metal foil.

Hereinafter, the film production device according to the first aspect will be described separately for a case where a metal foil cut into a predetermined size in advance is used as an object on which a film is to be formed (hereinafter referred to as a batch method) and a case where a long metal foil is used as an object on which a film is to be formed (hereinafter referred to as a roll-to-roll method.).

A. Batch Method

In the present exemplary embodiment, the heat generator is, for example, a stage. The metal foil is heated by being placed on the stage in the chamber. The stage makes contact with a part of the metal foil.

[I-i-th Exemplary Embodiment]

Figure 4:
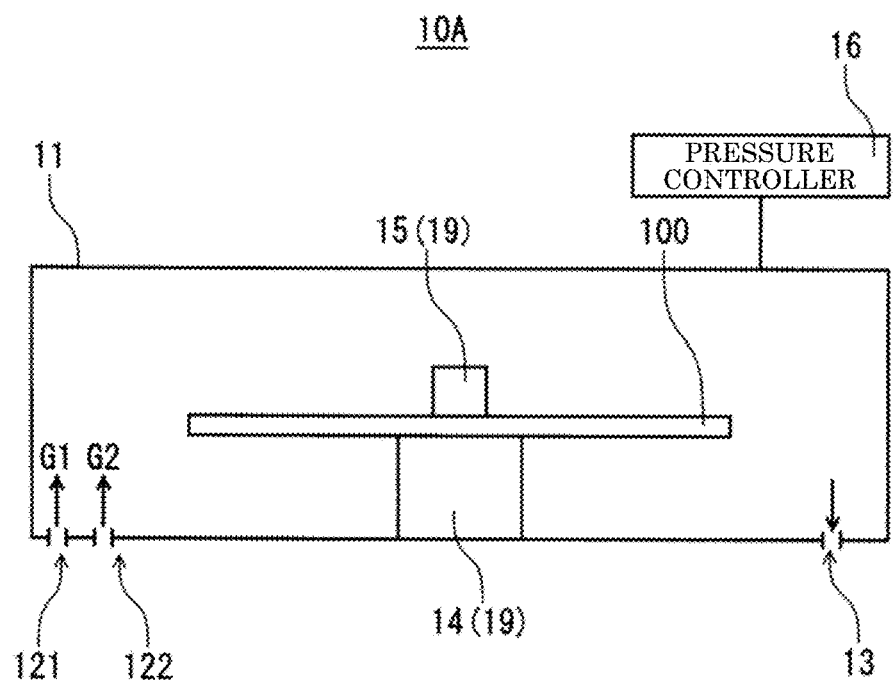
FIG. 4 is a side view conceptually illustrating an example of the film production device according to the first aspect of the present invention.

FIG. 4 is a side view conceptually illustrating an example of the film production device according to the first aspect, which is used in a batch method.

Film production device 10A includes chamber 11 capable of supplying and discharging the first gas and the second gas. Chamber 11 includes first supply port 121 for supplying first gas G1 into chamber 11 and second supply port 122 for supplying second gas G2 into chamber 11. Chamber 11 further includes exhaust port 13 for discharging first gas G1 and second gas G2. First gas G1 and second gas G2 may be discharged from different exhaust ports.

A pressure in chamber 11 is controlled by pressure controller 16. When first gas G1 and second gas G2 are supplied into chamber 11, pressure controller 16 controls a pressure in chamber 11 to be a reduced pressure atmosphere.

Stage 14 is disposed in chamber 11. Stage 14 includes a flat portion that makes contact with metal foil 100. Metal foil 100 is placed on stage 14 such that a part of metal foil 100 makes contact with stage 14. Since metal foil 100 has appropriate rigidity, metal foil 100 is supported by stage 14 without excessive sagging or slackening. Stage 14 is heat generator 19. Since metal foil 100 has good thermal conductivity, entire metal foil 100 can be quickly heated by stage 14 that makes contact with a part of metal foil 100.

Since metal foil 100 is supported in a substantially planar manner by stage 14, first gas G1 and second gas G2 supplied into chamber 11 can make contact with both main surfaces of metal foil 100. Thus, at least one dielectric layer is formed on both main surfaces of metal foil 100 by a single treatment.

Pressing member 15 for pressing metal foil 100 toward stage 14 is disposed at a position corresponding to stage 14. Pressing member 15 includes a planar portion that makes contact with metal foil 100. Pressing member 15 may be heat generator 19.

[I-ii-th Exemplary Embodiment]

Figure 5:
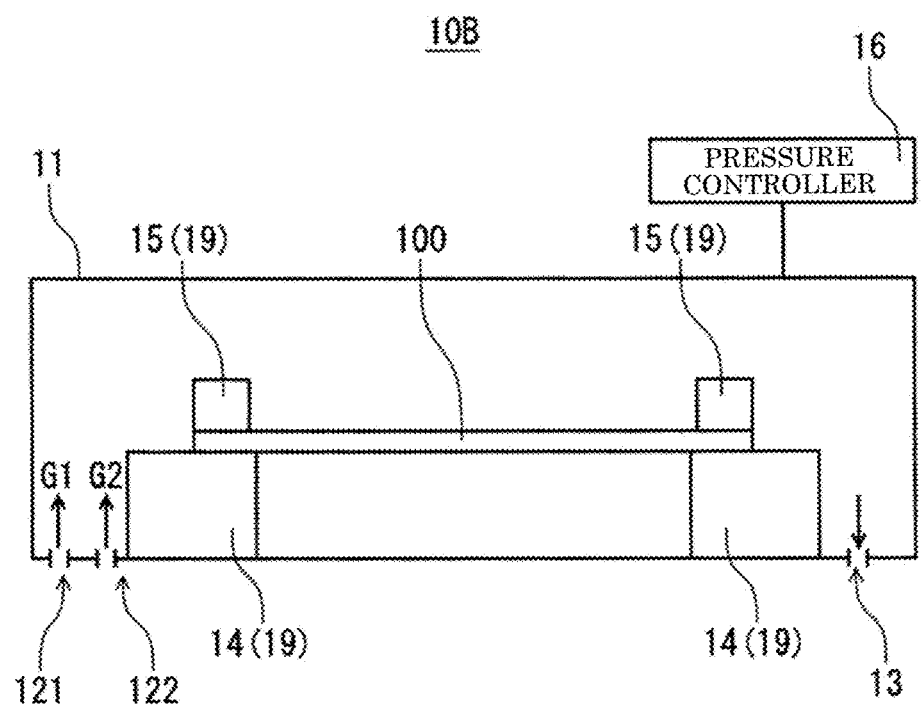
FIG. 5 is a side view conceptually illustrating another example of the film production device according to the first aspect of the present invention.

FIG. 5 is a side view conceptually illustrating another example of the film production device according to the first aspect. Film production device 10B has a similar configuration to film production device 10A except that a plurality of stages 14 are provided. At least one stage 14 is heat generator 19.

B. Roll-to-Roll Method

In the present exemplary embodiment, the heat generator makes contact with a part of the metal foil conveyed in the first chamber. The metal foil is heated while being conveyed. The heat generator may be a conveying roll, a positioning member that positions the conveyed metal foil, or a stage that supports the conveyed metal foil.

In a case where the first gas and the second gas are supplied and discharged in one chamber, the chamber may be divided into a plurality of zones. For example, the chamber may include a first supply zone to which the first gas is supplied, a second supply zone to which the second gas is supplied, a first exhaust zone for purging the first gas, and a second exhaust zone for purging the second gas. The zones are separated, for example, by walls of an inert gas (nitrogen, argon, or the like). However, the plurality of zones can be regarded as a single space. Furthermore, portions of the chamber other than the above zones also form one space together with the above plurality of zones. The metal foil may pass through each zone multiple times.

[I-iii-th Exemplary Embodiment]

Figure 6:
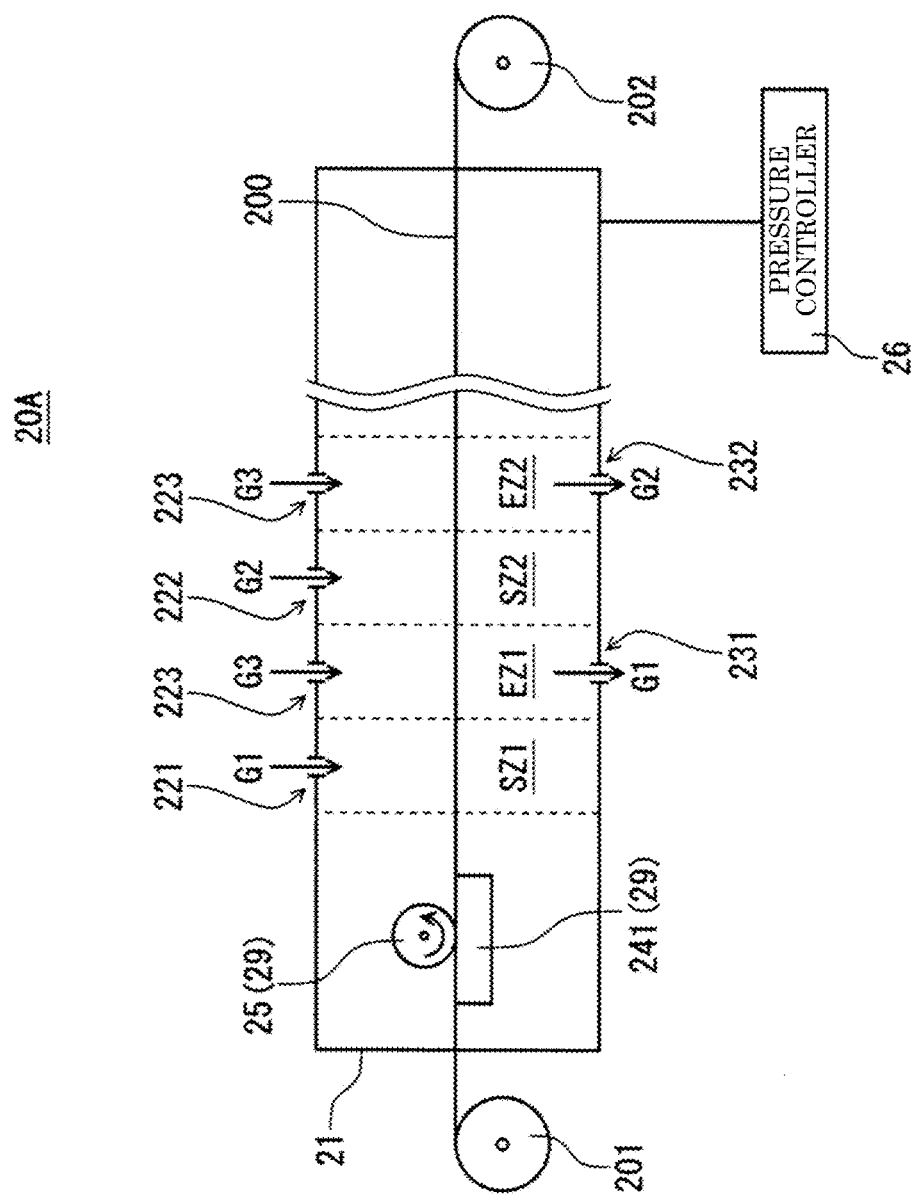
FIG. 6 is a side view conceptually illustrating another example of the film production device according to the first aspect of the present invention.

FIG. 6 is a side view conceptually illustrating an example of the film production device according to the first aspect, which is used in the roll-to-roll method.

Film production device 20A includes chamber 21 capable of supplying and discharging the first gas and the second gas. Chamber 21 includes first supply zone SZ1 to which first gas G1 is supplied, second supply zone SZ2 to which second gas G2 is supplied, first exhaust zone EZ1 for purging first gas G1, and second exhaust zone EZ2 for purging second gas G2. The zones are arranged in this order so as to separate chamber 21 in a direction intersecting a conveyance direction.

Chamber 21 includes first supply port 221 for supplying first gas G1 to first supply zone SZ1 and second supply port 222 for supplying second gas G2 to second supply zone SZ2. Chamber 21 includes first exhaust port 231 for discharging first gas G1 from first exhaust zone EZ1 and second exhaust port 232 for discharging second gas G2 from second exhaust zone EZ2.

In a region at an upstream side of chamber 21, stage 241 supporting metal foil 200 that is conveyed is located. Stage 241 is heat generator 29. Stage 241 includes a flat portion that makes contact with metal foil 200. Heat generator 29 is located at an upstream side with respect to first supply zone SZ1. Heat generator 29 may be located in most upstream first supply zone SZ1. Heat generator 29 may be further located in at least one of first exhaust zone EZ1, second supply zone SZ2, and second exhaust zone EZ2.

Inert gas G3 (e.g., nitrogen gas) is supplied from third supply port 223 to first exhaust zone EZ1. This separates first supply zone SZ1 and second supply zone SZ2 and purges unreacted first gas G1 from first exhaust port 231.

Similarly, inert gas G3 is supplied from third supply port 223 to second exhaust zone EZ2. This separates second supply zone SZ2 and other portions in chamber 21 and purges unreacted second gas G2 from second exhaust port 232. The same kind of third gas G3 may be supplied to first exhaust zone EZ1 and second exhaust zone EZ2 or different kinds of third gas G3 may be supplied to first exhaust zone EZ1 and second exhaust zone EZ2. The purging from each exhaust port is appropriately performed. An exhaust port to be used may be determined as needed. An exhaust port may be further added as needed.

Film production device 20A may include a plurality of combinations of first supply zone SZ1, first exhaust zone EZ1, second supply zone SZ2, and second exhaust zone EZ2 according to a desired thickness of a dielectric layer. The same kind of first gas G1 may be supplied to the plurality of first supply zones SZ1 or different kinds of first gas G1 may be supplied to the plurality of first supply zones SZ1. The same kind of second gas G2 may be supplied to the plurality of second supply zones SZ2 or different kinds of second gas G2 may be supplied to the plurality of second supply zones SZ2.

Metal foil 200 may pass through the combinations of first supply zone SZ1, first exhaust zone EZ1, second supply zone SZ2, and second exhaust zone EZ2 a plurality of times according to the desired thickness of the dielectric layer.

A pressure in chamber 21 is controlled by pressure controller 26 so as to be a reduced pressure atmosphere. Pressure controller 26 may appropriately control the pressure in each zone.

Metal foil 200 is wound around supply reel 201 rotationally driven by a motor, and is supplied to an upstream side in chamber 21 while being unwound from supply reel 201. Metal foil 200 is heated by contact with stage 241 (heat generator 29) on an upstream side in chamber 21 and is then conveyed to a downstream side.

Pressing member 25 for pressing metal foil 200 toward stage 241 is disposed at a position corresponding to stage 241. Pressing member 25 has a roll shape and supports conveyance of metal foil 200. Pressing member 25 may be a heat generator.

In another exemplary embodiment, stage 241 is not a heat generator, and pressing member 25 is a heat generator.

Heated metal foil 200 is first conveyed into first supply zone SZ1. In first supply zone SZ1, first gas G1 is supplied from first supply port 221 to both surfaces of metal foil 200, and molecules including the second metal adhere to both surfaces of metal foil 200.

Next, metal foil 200 is conveyed into first exhaust zone EZ1. In first exhaust zone EZ1, inert gas G3 is supplied from third supply port 223, and unreacted first gas G1 is discharged from first exhaust port 231.

Subsequently, metal foil 200 is conveyed into second supply zone SZ2. In second supply zone SZ2, second gas G2 is supplied from second supply port 222 to both surfaces of metal foil 200. The molecules including the second metal adhering to both surfaces of metal foil 200 react with the oxidant to form a dielectric layer containing an oxide of the second metal. Thus, a dielectric layer containing the oxide of the second metal is formed on both surfaces of metal foil 200.

Finally, metal foil 200 is conveyed into second exhaust zone EZ2. In second exhaust zone EZ2, inert gas G3 is supplied from third supply port 223, and unreacted second gas G2 is discharged from second exhaust port 232.

After the oxide having a desired thickness is deposited, metal foil 200 is carried out of chamber 21 and wound around collecting reel 202. Collecting reel 202 is rotationally driven by a motor.

[I-iv-th Exemplary Embodiment]

Figure 7:
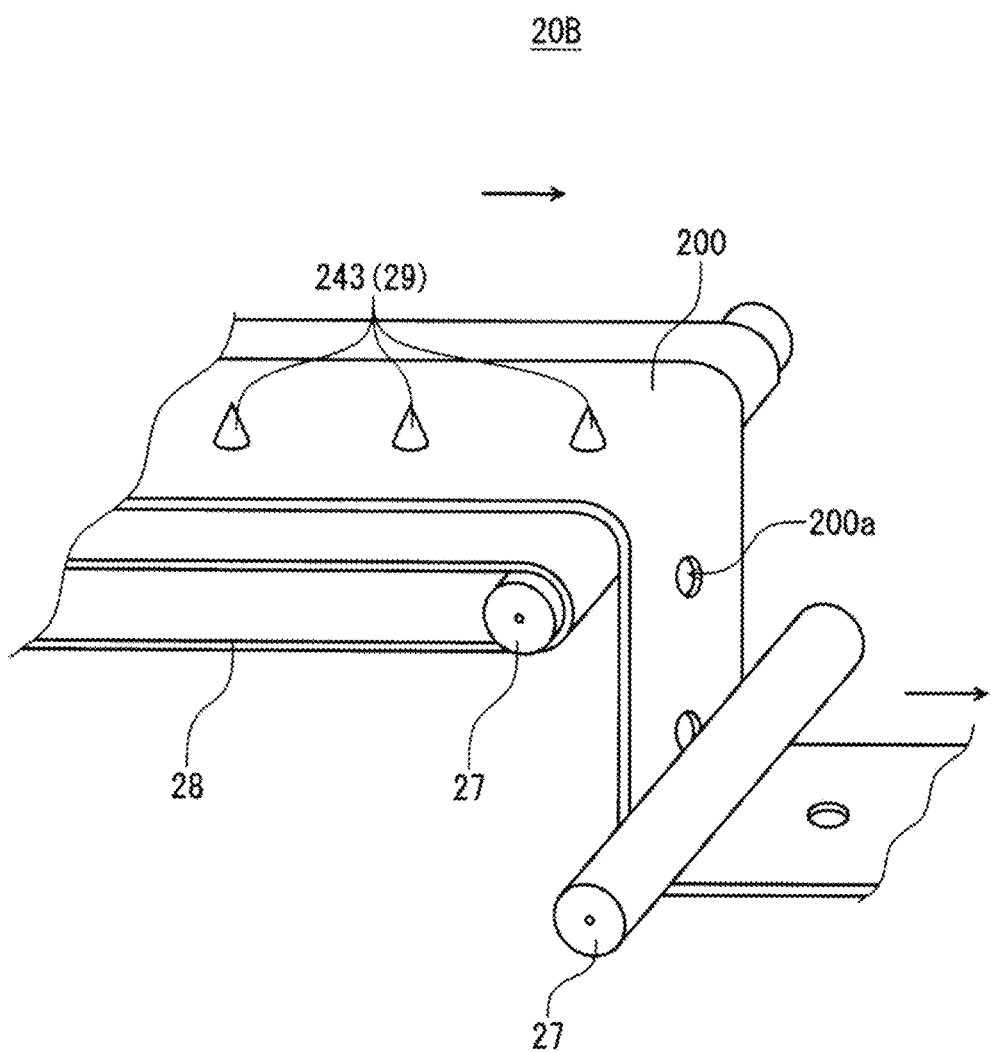
FIG. 7 is a side view conceptually illustrating a main part of another film production device according to the first aspect of the present invention.

FIG. 7 is a side view conceptually illustrating a main part of another film production device according to the first aspect. Film production device 20B has a similar configuration to film production device 20A except for a shape and a position of a heat generator.

In film production device 20B, metal foil 200 that has been unwound from supply reel 201 is placed on conveyance belt 28 to be carried to chamber 21 at an upstream side. Conveyance belt 28 includes positioning member 243 for fixing and positioning metal foil 200, which is disposed on conveyance belt 28. Metal foil 200 has one or more through holes 200a, and positioning member 243 is inserted into through hole 200a. In this way, metal foil 200 is positioned. Positioning member 243 is heat generator 29. Hence, metal foil 200 is heated by making contact with positioning member 243 around through hole 200a. Thereafter, metal foil 200 is separated from conveyance belt 28 and conveyed to first supply zone SZ1 by conveying roll 27. Thereafter, metal foil 200 is processed in a similar manner to film production device 20A, and thus a dielectric layer is formed on both surfaces of metal foil 200.

[I-v-th Exemplary Embodiment]

Figure 8:
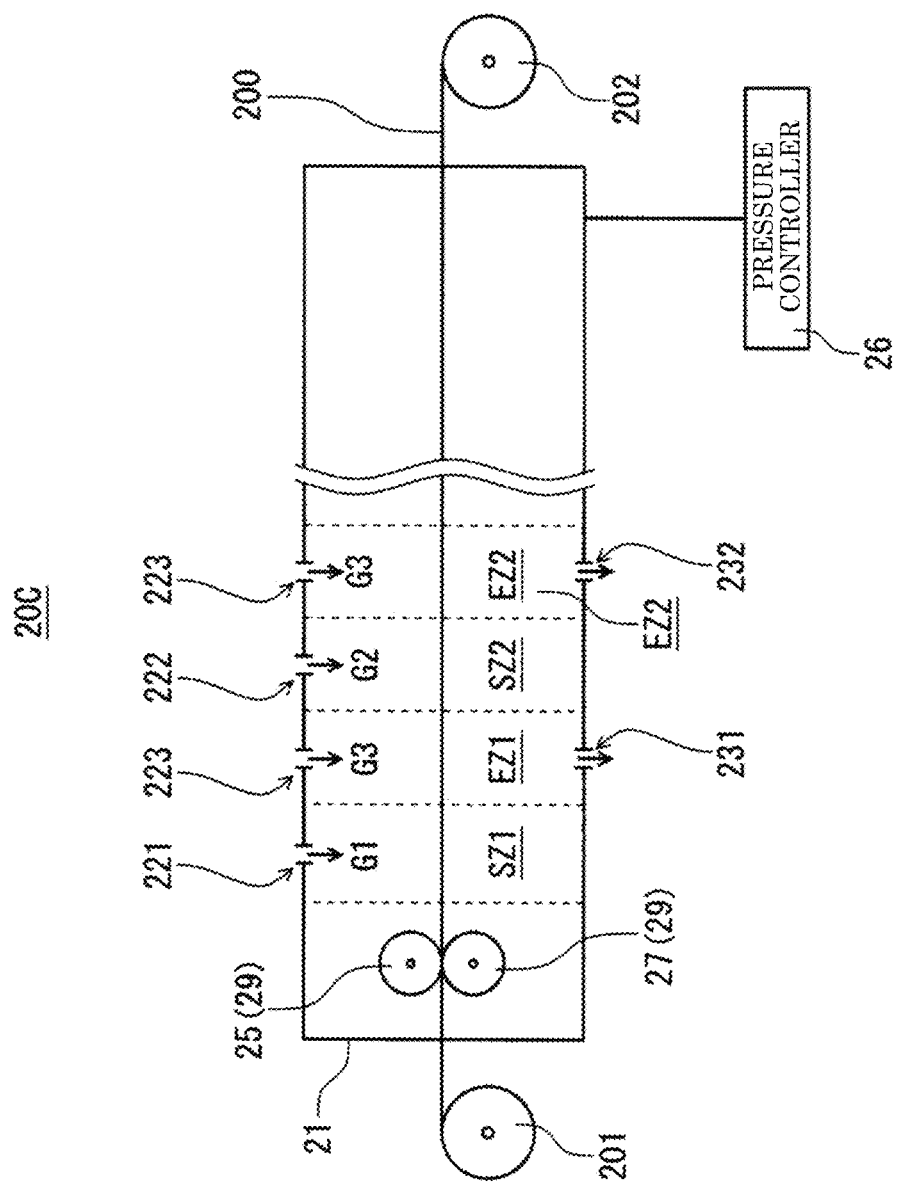
FIG. 8 is a side view conceptually illustrating another example of the film production device according to the first aspect of the present invention.

FIG. 8 is a side view conceptually illustrating another example of the film production device according to the first aspect. Film production device 20C has a similar configuration to film production device 20A except for a shape of a heat generator.

In film production device 20C, metal foil 200 that has been unwound from supply reel 201 is conveyed into first supply zone SZ1 by conveying roll 27. Conveying roll 27 is heat generator 29. Hence, metal foil 200 is conveyed and heated by conveying roll 27. Roll-shaped pressing member 25 is disposed at a position corresponding to conveying roll 27. Pressing member 25 may be heat generator 29. Then, metal foil 200 is conveyed into first supply zone SZ1. Thereafter, metal foil 200 is processed in a similar manner to film production device 20A, and thus a dielectric layer is formed on both surfaces of metal foil 200.

[I-vi-th Exemplary Embodiment]

Figure 9:
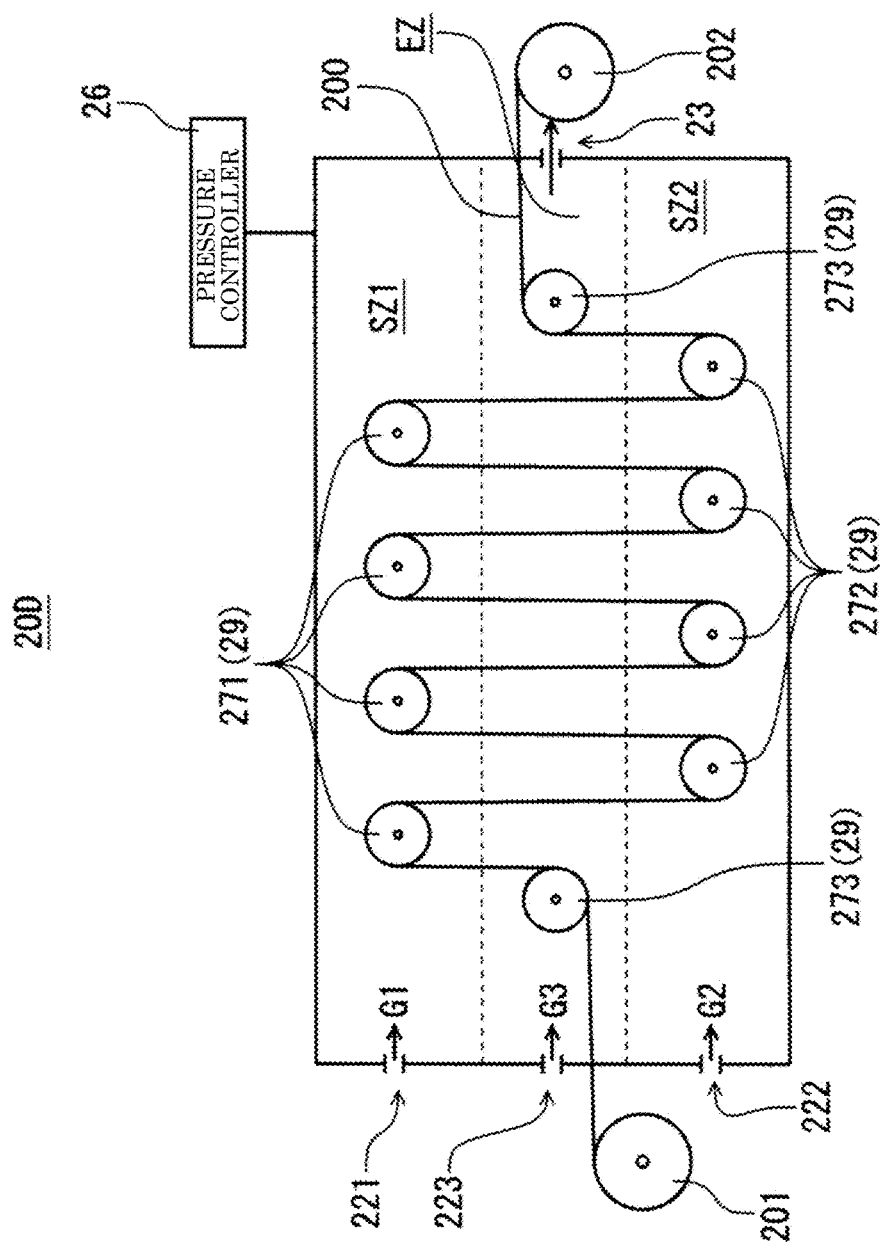
FIG. 9 is a side view conceptually illustrating another example of the film production device according to the first aspect of the present invention.

FIG. 9 is a side view conceptually illustrating another example of the film production device according to the first aspect.

Film production device 20D includes chamber 21 capable of supplying and discharging first gas and second gas. Metal foil 200 is conveyed to turn back a plurality of times in chamber 21. A number of times of turning back is not limited in particular.

Chamber 21 includes first supply zone SZ1 to which first gas G1 is supplied, second supply zone SZ2 to which second gas G2 is supplied, and exhaust zone EZ for purging first gas G1 and second gas G2. The zones are arranged so as to separate chamber 21 along a conveyance direction. In first supply zone SZ1, a plurality of first conveying rolls 271 are disposed. In second supply zone SZ2, a plurality of second conveying rolls 272 are disposed. At least one of first conveying rolls 271 and second conveying rolls 272 is heat generator 29. Third conveying roll 273 disposed in exhaust zone EZ may be heat generator 29.

Metal foil 200 is supplied to chamber 21 at an upstream side while being unwound from supply reel 201. Metal foil 200 is redirected by third conveying roll 273 and conveyed into first supply zone SZ1. In first supply zone SZ1, first gas G1 is supplied from first supply port 221 to both surfaces of metal foil 200, and molecules including the second metal adhere to both surfaces of metal foil 200.

Metal foil 200 is turned back by first conveying roll 271 and conveyed into exhaust zone EZ. In exhaust zone EZ, inert gas G3 (e.g., nitrogen gas) is supplied from third supply port 223, and unreacted first gas G1 is purged from exhaust port 23. The exhaust port may be, for example, added to first supply zone SZ1 and/or second supply zone SZ2 as necessary.

Subsequently, metal foil 200 is conveyed into second supply zone SZ2. In second supply zone SZ2, second gas G2 is supplied from second supply port 222 to both surfaces of metal foil 200. The molecules including the second metal, which have been adhered to both surfaces of metal foil 200, react with an oxidant to form an oxide of the second metal. Thus, a dielectric layer containing the oxide of the second metal is formed on both surfaces of metal foil 200.

Metal foil 200 is turned back at second conveying roll 272 and conveyed into exhaust zone EZ again. In exhaust zone EZ, unreacted second gas G2 is also purged from exhaust port 23.

Metal foil 200 is then conveyed again into first supply zone SZ1. Thereafter, conveyance into and from first supply zone SZ1, exhaust zone EZ, and second supply zone SZ2 is repeated, and thus an oxide having a desired thickness is deposited on metal foil 200. Finally, metal foil 200 is conveyed out of chamber 21 and wound around collecting reel 202.

II. Second Aspect

In the present aspect, a voltage is applied to a metal foil in the presence of first gas. This allows molecules including a second metal to be electrically attracted to the metal foil, thereby increasing a concentration of the second metal in the vicinity of the metal foil. As a result, reaction efficiency is improved, and a uniform dielectric layer is formed. In addition, the molecules including the second metal are efficiently used. Further, since the second metal is easily adhered to the metal foil, denseness of a formed layer containing a metal oxide is improved.

[Film Production Method]

Figure 10:
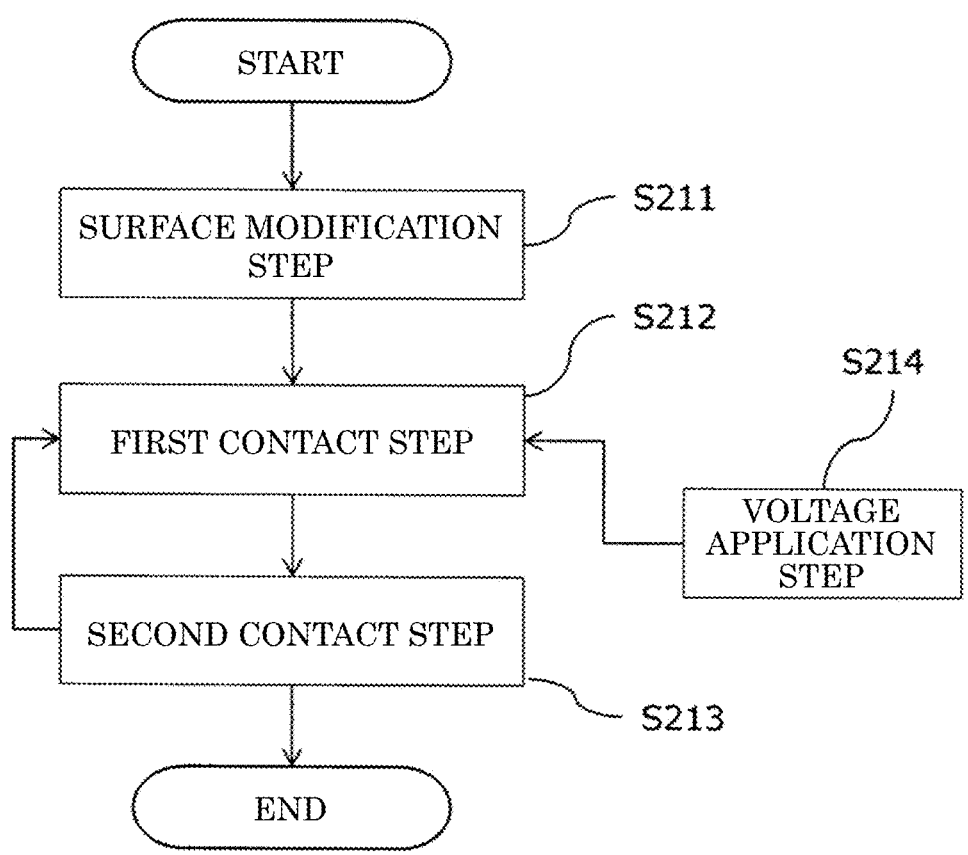
FIG. 10 is a flowchart illustrating a film production method according to a second aspect of the present invention.

A film production method according to the second aspect includes a first application step (hereinafter simply referred to as an application step) of applying a voltage to a metal foil in the presence of first gas. FIG. 10 is a flowchart illustrating a film production method according to the second aspect.

The film production method according to the second aspect includes similar steps to (iii) the first contact step and (iv) the second contact step in the film production method according to the first aspect except that the application step is included instead of the heating step. The film production method according to the second aspect may include a similar step to (i) the surface modification step in the film production method according to the first aspect.

(i) Surface Modification Step (S211)

A surface of the metal foil may be modified in a similar manner to (i) the surface modification step in the film production method according to the first aspect.

(ii) First Contact Step (S212) and Application Step (S214)

The metal foil is brought into contact with the first gas containing the second metal in a similar manner to (iii) the first contact step in the film production method according to the first aspect. In this step, a voltage is applied to the metal foil in contact with one or more first power feeders (hereinafter simply referred to as a power feeder). The power feeder may be in contact with the metal foil in a chamber or outside the chamber.

The voltage is applied to the metal foil by generating a potential difference between an electrode foil and a counter electrode. The voltage difference can be generated by using a constant voltage, a pulsed voltage, a waveform in which an alternating current is superimposed, or another irregular waveform. The voltage difference is not limited in particular. The voltage difference is preferably 5 V or more and 1000 V or less, and preferably 10 V or more and 800 V or less. In a case where the potential difference is in this range, the effect of voltage application is easily obtained, and damage to the metal foil and the film production device is easily suppressed.

A voltage may be applied while using the metal foil as a positive electrode or a voltage may be applied while using the metal foil as a negative electrode. The polarity of the metal foil may be appropriately set in accordance with a charged state of the first gas.

(iii) Second Contact Step (S213)

The second gas is brought into contact with the metal foil in a similar manner to (iv) the second contact step in the film production method according to the first aspect. Thus, a layer containing a metal oxide is formed on the surface of the metal foil.

The order of the steps is not limited in particular. Typically, the second gas is brought into contact with the metal foil after the first gas is brought into contact with the metal foil. The first contact step and the second contact step may be repeatedly performed a plurality of times.

[Method for Producing Electrode Foil]

A method for producing an electrode foil according to the second aspect includes an application step of applying a voltage to a metal foil in the presence of the first gas.

In the film production method and the method for producing an electrode foil according to the second aspect, both a metal foil having a predetermined size and a long metal foil are objects on which a film is to be formed. The electrode foil produced by the above method is suitably used as an anode body of an electrolytic capacitor.

Figure 11:
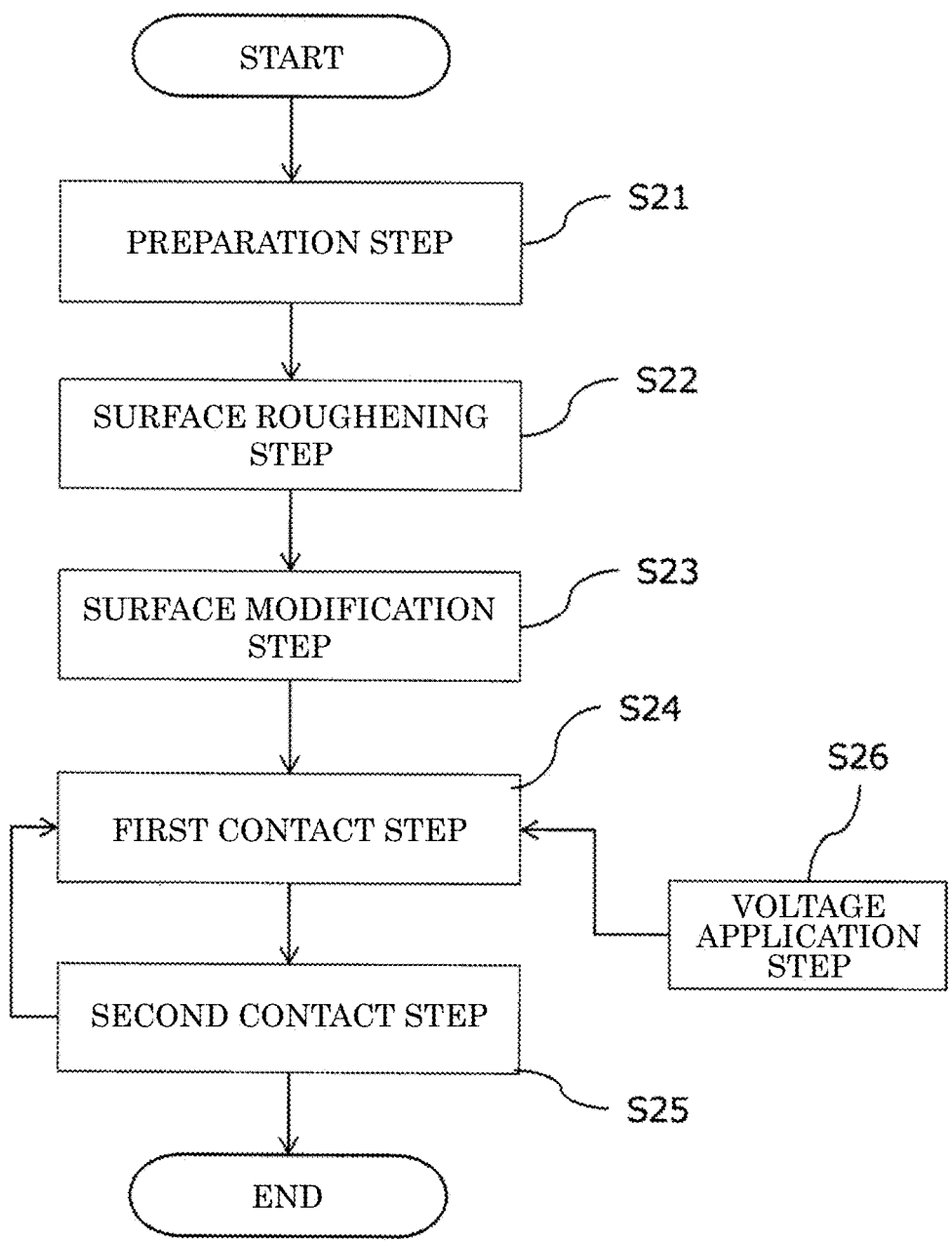
FIG. 11 is a flowchart illustrating a method for producing an electrode foil according to the second aspect of the present invention.

Hereinafter, the method for producing an electrode foil according to the second aspect will be described in detail for each step. FIG. 11 is a flowchart illustrating a method for producing an electrode foil according to the second aspect.

(1) Preparation Step (S21)

A metal foil similar to that described in the film production method according to the first aspect is prepared. The metal foil may have another dielectric layer formed inside pits formed by roughening.

(2) Surface Roughening Step (S22)

A surface of the metal foil may be roughened before the first contact step. The roughening is performed in a similar manner to (2) the surface roughening step in the method for producing an electrode foil according to the first aspect. In a case where the surface of the metal foil is roughened as described above, it is usually difficult to form a dielectric layer to the insides of the pits by a method other than anodization. By applying a voltage as in the present aspect, it is easy to form a uniform dielectric layer to the insides of the pits. This step is preferably performed in a case where a dielectric layer containing an oxide of the second metal is formed and then a third dielectric layer described later is formed by anodization. In a case where the third dielectric layer is a porous structure, this step may be omitted.

A pore diameter of the pits formed on the surface of the metal foil is not limited in particular. The pore diameter of the pits is preferably 50 nm or more and 2000 nm or less from the viewpoint of easily increasing a surface area. It is preferable that the pore diameter of the pits is not excessively large from the viewpoint of a contact property between the metal foil and the power feeder. The pore diameter of the pits is more preferably 80 nm or more and 1300 nm or less. In a case where the pore diameter of the pits is in this range, the metal foil and the power feeder easily come into contact with each other, and a voltage tends to be uniformly applied to the metal foil.

A thickness of an etched layer is not limited in particular, and may be appropriately set according to the thickness of the metal foil. In a case where the metal foil is used as an anode of an electrolytic capacitor, the thickness of the etched layer is preferably 5 µm or more, more preferably 15 µm or more, from the viewpoint of capacitance. In a case where the thickness of the etched layer is in this range, the effect of voltage application is easily obtained. From the viewpoint of strength of the metal foil, the thickness of the etched layer is preferably 100 µm or less, more preferably 80 µm or less.

(3) Surface Modification Step (S23)

Surface modification treatment for modifying the surface of the metal foil may be performed before a first contact step. The surface modification step is performed in a manner similar to (i) the surface modification step in the film production method according to the first aspect.

(4) First Contact Step (S24) and Application Step (S26)

The steps are performed in a similar manner to (ii) the first contact step and the application step in the film production method according to the second aspect.

(5) Second Contact Step (S25)

This step is performed in a similar manner to (iii) the second contact step in the film production method according to the second aspect. As a result, a dielectric layer containing an oxide of the second metal is formed on both surfaces of the metal foil.

After the dielectric layer is formed, the metal foil may be chemically converted. As a result, the third dielectric layer containing an oxide of the first metal constituting the metal foil is formed between the metal foil and the dielectric layer. Hence, a layer having a uniform thickness without pinholes is easily formed as an entirety of the dielectric layer. A method for chemically converting the metal foil is not limited in particular. The chemically converting is performed, for example, by anodization.

III. Third Aspect

In the present aspect, a voltage is applied to a metal foil in the presence of second gas. This allows an oxidant to be electrically attracted to the metal foil, thereby increasing an oxygen concentration in the vicinity of the metal foil. Since the metal foil thus becomes in a state of being easily oxidized, a uniform dielectric layer is formed. In addition, the oxidant is efficiently used. Furthermore, since the oxidant is easily adhered to the metal foil, denseness of a formed layer containing the metal oxide is improved.

[Film Production Method]

Figure 12:
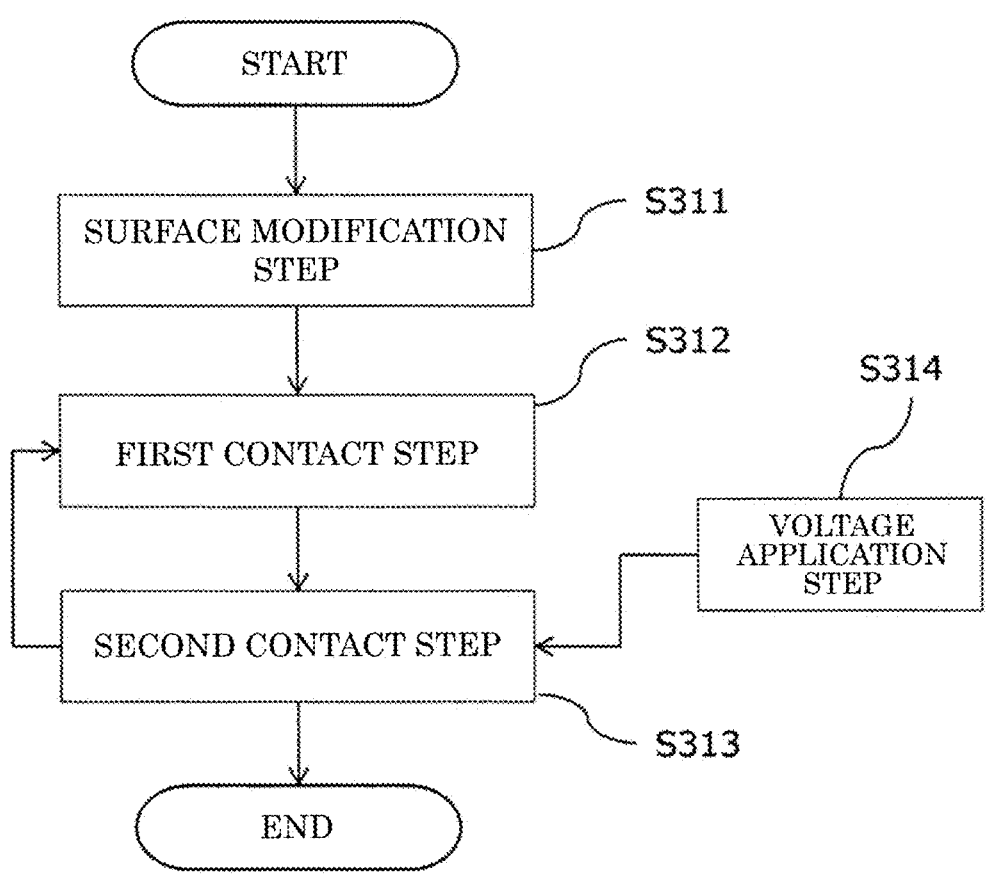
FIG. 12 is a flowchart illustrating a film production method according to a third aspect of the present invention.

The film production method according to the third aspect includes a second application step (hereinafter simply referred to as an application step) of applying a voltage to a metal foil in the presence of second gas. FIG. 12 is a flowchart illustrating a film production method according to the third aspect.

The film production method according to the third aspect includes similar steps to the film production method and the method for producing an electrode foil according to the second aspect except that a voltage is applied in the presence of the second gas instead of the first gas.

(i) Surface Modification Step (S311)

A surface of the metal foil may be modified in a similar manner to (i) the surface modification step in the film production method according to the second aspect.

(ii) First Contact Step (S312)

The metal foil is brought into contact with first gas containing a second metal in a similar manner to (ii) the first contact step in the film production method according to the second aspect.

(iii) Second Contact Step (S313) and Application Step (S314)

The second gas is brought into contact with the metal foil in a similar manner to (iii) the second contact step in the film production method according to the first aspect. In this step, a voltage is applied to the metal foil by bringing a part of the metal foil into contact with one or more second power feeders (hereinafter simply referred to as a power feeder). Thus, a layer containing a metal oxide is formed on the surface of the metal foil. The power feeder may be in contact with the metal foil in a chamber or outside the chamber.

The order of the steps is not limited in particular. Typically, the second gas is brought into contact with the metal foil after the first gas is brought into contact with the metal foil. The first contact step and the second contact step may be repeatedly performed a plurality of times.

After the dielectric layer is formed, the metal foil may be chemically converted. As a result, the third dielectric layer containing an oxide of the first metal constituting the metal foil is formed between the metal foil and the dielectric layer. Hence, a layer having a uniform thickness without pinholes is easily formed as an entirety of the dielectric layer. A method for chemically converting the metal foil is not limited in particular. The chemical conversion is performed, for example, by anodization.

[Method for Producing Electrode Foil]

A method for producing an electrode foil according to the third aspect includes an application step of applying a voltage to a metal foil in the presence of the second gas.

In the film production method and the method for producing an electrode foil according to the third aspect, both a metal foil having a predetermined size and a long metal foil are objects on which a film is to be formed. The electrode foil produced by the above method is suitably used as an anode body of an electrolytic capacitor.

Figure 13:
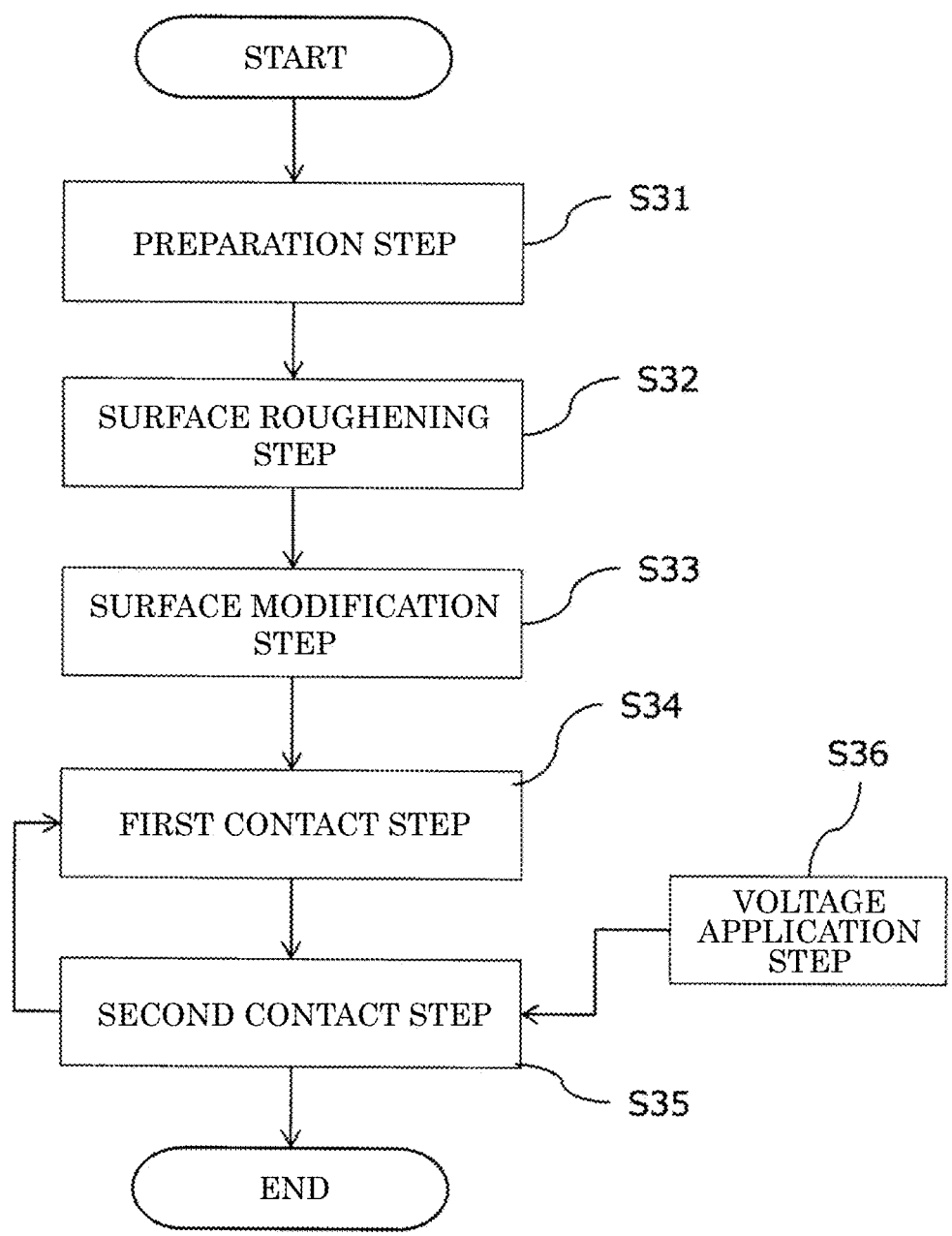
FIG. 13 is a flowchart illustrating a method for producing an electrode foil according to the third aspect of the present invention.

Hereinafter, the method for producing an electrode foil according to the third aspect will be described in detail for each step. FIG. 13 is a flowchart illustrating a method for producing an electrode foil according to the third aspect.

(1) Preparation Step (S31)

A metal foil similar to that described in the film production method according to the first aspect is prepared. The metal foil may have another dielectric layer formed inside pits formed by roughening.

(2) Surface Roughening Step (S32)

A surface of the metal foil may be roughened before the first contact step. The roughening is performed in a similar manner to (2) the surface roughening step in the method for producing an electrode foil according to the first aspect.

(3) Surface Modification Step (S33)

Surface modification treatment for modifying the surface of the metal foil may be performed before a first contact step. The surface modification step is performed in a similar manner to (i) the surface modification step in the film production method according to the first aspect.

(4) First Contact Step (S34)

This step is performed in a similar manner to (ii) the first contact step in the film production method according to the third aspect.

(5) Second Contact Step (S35) and Second Application Step (S36)

These steps are performed in a similar manner to (iii) the second contact step and the second application step in the film production method according to the third aspect.

Figure 14:
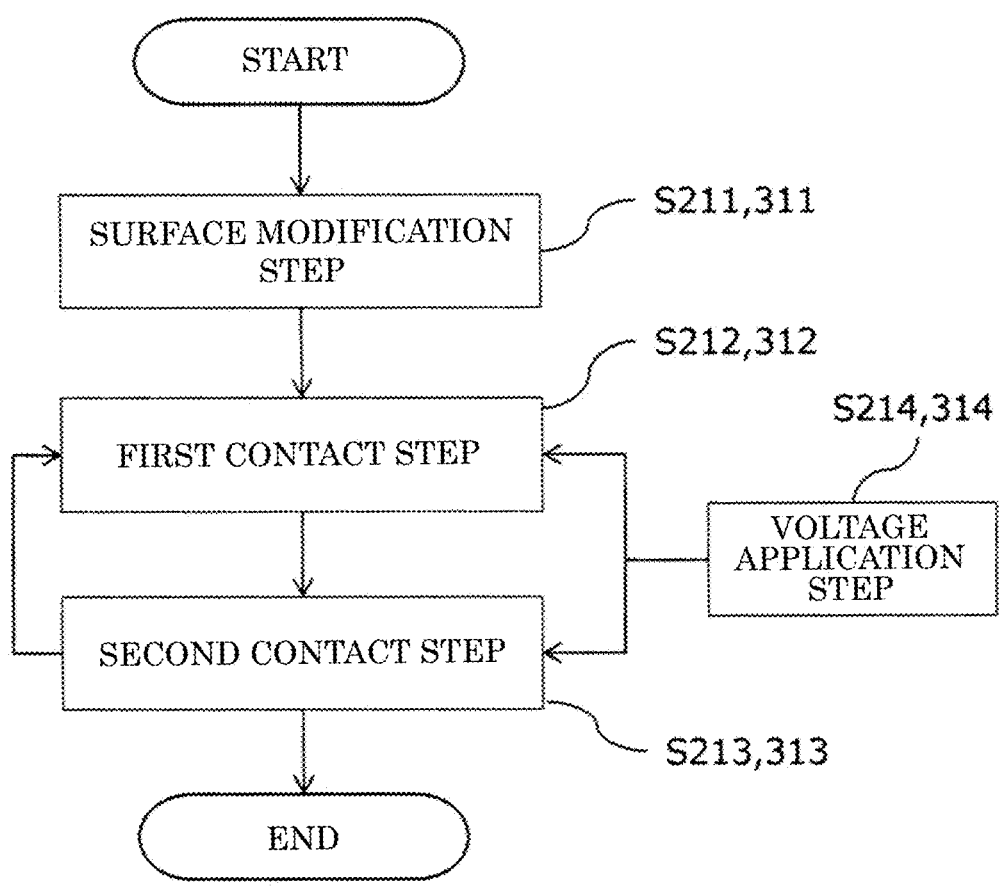
FIG. 14 is a flowchart illustrating a film production method according to the second and third aspects of the present invention.
Figure 15:
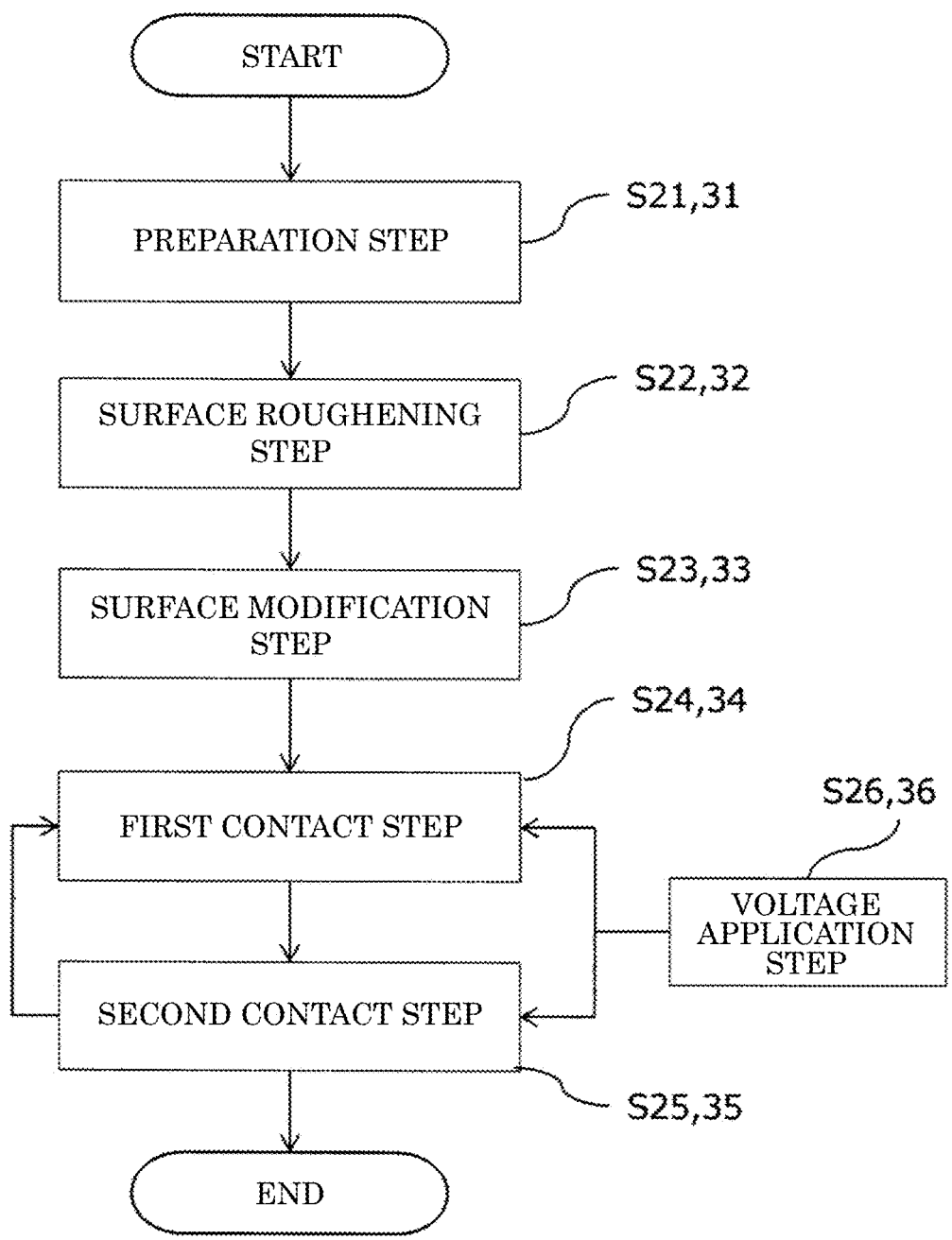
FIG. 15 is a flowchart illustrating a method for producing an electrode foil according to the second and third aspects of the present invention.

A voltage may be applied to the electrode foil in both the presence of the first gas and the presence of the second gas. This forms a more uniform layer. FIG. 14 is a flowchart illustrating a film production method according to the present aspect. FIG. 15 is a flowchart illustrating a method for producing an electrode foil according to the present aspect.

This aspect is different from the second aspect in that (iii) a voltage is applied to the metal foil also in the second contact step, and is different from the third aspect in that (ii) a voltage is applied to the metal foil also in the first contact step. The present aspect has similar steps to the second aspect and the third aspect except for these points.

[Film Production Device]

A film production device according to the second and third aspects includes a power feeder that makes contact with a part of a metal foil on which a film is to be formed, and a counter electrode that generates a voltage difference between the metal foil and the power feeder. The first gas and the second gas are supplied to be in contact with both main surfaces of the metal foil.

(Power Feeder)

The power feeder (first and second power feeders) applies a voltage to a metal foil on which a film is to be formed by making contact with a part of the metal foil. A number of power feeders may be one, two, or more. A shape of the power feeder is not limited in particular as long as a certain contact area is obtained between the power feeder and the metal foil.

The power feeder may be, for example, a supply reel and/or a collecting reel, may be a stage that supports the metal foil, may be a conveying roll, or may be a positioning member that positions the metal foil. In a case where a film is formed by roll-to-roll, the power feeder may be disposed inside the chamber or may be disposed outside the chamber. The power feeder is preferably disposed in the chamber, especially close to a contact point between the metal foil and the first and/or second gas from the perspective of reducing an energy loss. Meanwhile, the power feeder is preferably disposed outside the chamber in consideration of ease of maintenance and a degree of freedom in device design.

(Counter Electrode)

The counter electrode is used together with the power feeder and generates a voltage difference between the metal foil and the power feeder. A position of the counter electrode is not limited in particular as long as a voltage is applied to at least both surfaces of the metal foil. The counter electrode may not face a main surface of the metal foil. A number of counter electrodes may be one, two, or more. A shape of the counter electrode is also not limited in particular.

A distance between the metal foil and the counter electrode is not limited in particular. The distance between the metal foil and the counter electrode is preferably 0.5 mm or more and 500 mm or less. In a case where the distance between the metal foil and the counter electrode is within this range, the distance between the metal foil and the counter electrode can be easily kept constant when the metal foil is conveyed. This makes it easy to avoid a local increase in applied voltage and contact between the metal foil and the counter electrode. Furthermore, a uniform layer is easily formed. The distance between the metal foil and the counter electrode is more preferably 1 mm or more and 200 mm or less, and particularly preferably 1 mm or more and 130 mm or less. In a case where the distance between the metal foil and the counter electrode is within this range, a size of equipment can be reduced, and an energy loss can be reduced. In a case where a plurality of counter electrodes are provided, distances from the metal foil to the counter electrodes need not be the same.

In a case where there are a plurality of chambers, the counter electrode need just be disposed in at least one of the chambers.

The film production device according to the second and third aspects includes a chamber, a pressure controller, a supply port, and an exhaust port similar to those of the film production device according to the first aspect except that a power feeder is provided instead of a heat generator. The film production device according to the second and third aspects may include members such as the support and the pressing member in the film production device according to the first aspect.

When a voltage is applied to the power feeder in a state where the metal foil is in contact with the first gas, the second aspect is executed. When a voltage is applied to the power feeder in a state where the metal foil is in contact with the second gas, the third aspect is executed.

In the film production method and the film production device according to the second and third aspects, a metal foil having a predetermined size can be an object on which a film is to be formed or a long metal foil can be an object on which a film is to be formed. The long metal foil is conveyed, for example, in a chamber, and a dielectric layer is continuously formed on the conveyed metal foil.

Hereinafter, as in the first aspect, the film production device according to the second and third aspects will be described separately for the batch method and the roll-to-roll method.

A. Batch Method

In the present exemplary embodiment, the power feeder (first and/or second power feeder) is, for example, a stage. The counter electrode is disposed close to the metal foil. Since the metal foil is placed on the stage in the chamber, a voltage can be applied to the metal foil, and a potential difference can be generated between the metal foil and the counter electrode. The stage makes contact with a part of the metal foil.

[II-i-th Exemplary Embodiment]

Figure 16:
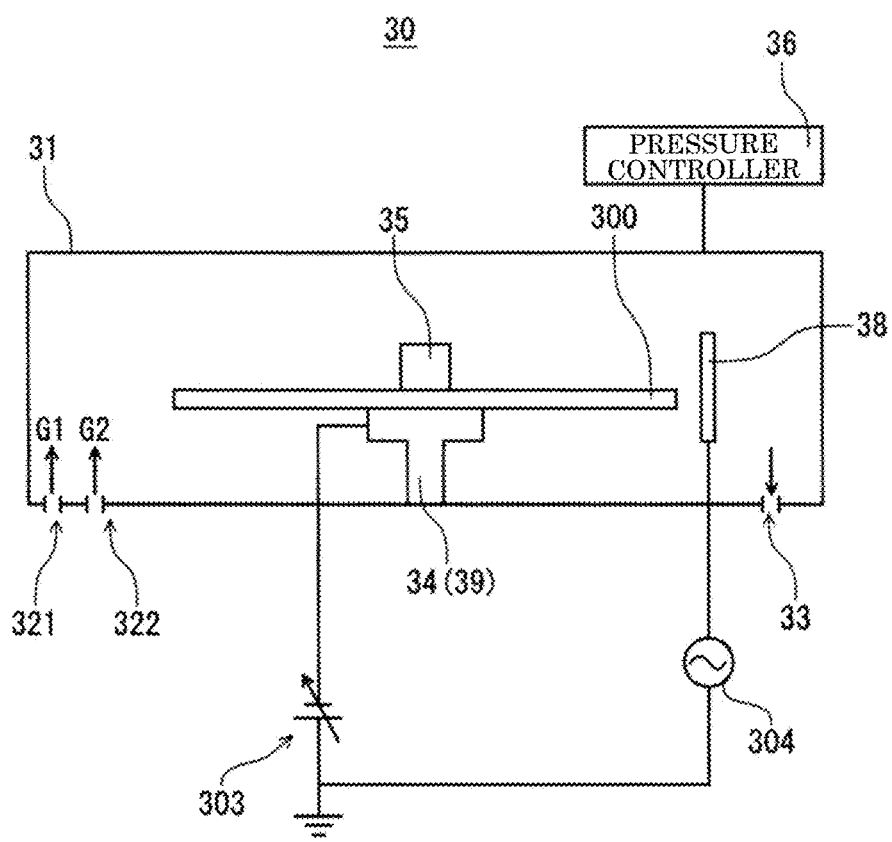
FIG. 16 is a side view conceptually illustrating an example of a film production device according to the second and third aspects of the present invention.

FIG. 16 is a side view conceptually illustrating an example of the film production device according to the second and third aspects, which is used in the batch method.

Film production device 30 has a similar configuration to film production device 10A illustrated in FIG. 4 except that film production device 30 includes stage 34 also serving as power feeder 39 and counter electrode 38 instead of a stage also serving as a heat generator.

That is, film production device 30 includes chamber 31. Chamber 31 includes first supply port 321, second supply port 322, and exhaust port 33. A pressure in chamber 31 is controlled by pressure controller 36. Metal foil 300 is pressed toward stage 34 by pressing member 35.

Film production device 30 further includes voltage adjusting device 303 and AC power supply 304. Note, however, that these members are optionally provided.

Single counter electrode 38 is disposed such that a voltage is applied to both surfaces of the metal foil. Meanwhile, the position of the counter electrodes is not limited to this, and for example, a plurality of counter electrodes may be disposed to face respective main surfaces of the metal foil. In a case where a plurality of counter electrodes are disposed, the counter electrodes are preferably disposed so as to be point-symmetric or line-symmetric about the metal foil.

B. Roll-to-Roll Method

In the present exemplary embodiment, a voltage is applied to a conveyed metal foil. The power feeder is disposed inside or outside the chamber. The power feeder may be a supply or collecting reel, may be a conveying roll, may be a positioning member that positions the conveyed metal foil, or may be a stage that supports the conveyed metal foil.

In a case where the first gas and the second gas are supplied and discharged in one chamber, the chamber may be divided into a plurality of zones as in the first aspect. The metal foil may pass through each zone multiple times.

[II-ii-th Exemplary Embodiment]

Figure 17:
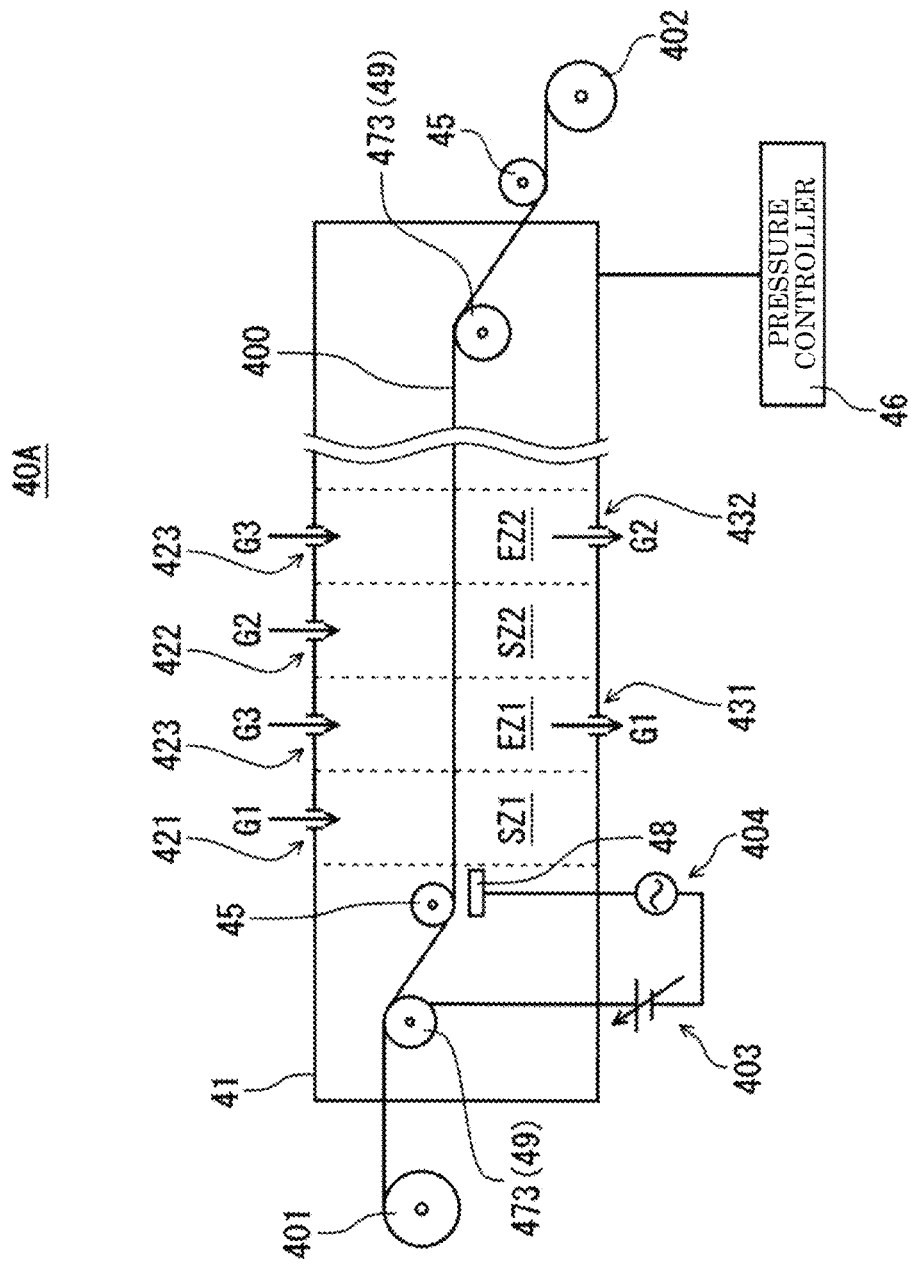
FIG. 17 is a side view conceptually illustrating another example of the film production device according to the second and third aspects of the present invention.

FIG. 17 is a side view conceptually illustrating an example of the film production device according to the second and third aspects, which is used in the roll-to-roll manner.

Film production device 40A has a similar configuration to film production device 20A illustrated in FIG. 6 except that film production device 40A includes third conveying roll 473 also serving as power feeder 49 and counter electrode 48 instead of a stage also serving as a heat generator.

That is, film production device 40A includes chamber 41. Chamber 41 includes first supply zone SZ1 to which first gas G1 is supplied, second supply zone SZ2 to which second gas G2 is supplied, first exhaust zone EZ1 for purging first gas G1, and second exhaust zone EZ2 for purging second gas G2. The zones are arranged in this order so as to separate chamber 21 in a direction intersecting a conveyance direction. First supply port 421, second supply port 422, third supply port 423, first exhaust port 431, and second exhaust port 432 are provided as appropriate in the zones. Purging from each exhaust port is appropriately performed. An exhaust port to be used may be determined as needed.

At least one counter electrode may be disposed on each side such that the counter electrodes face both main surfaces of the metal foil. In this case, variation in voltage applied to the metal foil is suppressed. The counter electrode may be arranged in first supply zone SZ1 and/or in second supply zone SZ2.

A pressure in chamber 41 is controlled by pressure controller 46 so as to be a reduced pressure atmosphere. Pressure controller 46 may appropriately control the pressure in each zone. Metal foil 400 is wound around supply reel 401 rotationally driven by a motor, and is supplied to chamber 41 at an upstream side while being unwound from supply reel 401. Metal foil 400 is collected by collecting reel 402 after processing.

Third conveying roll 473 that conveys metal foil 400 is disposed at an upstream side of chamber 21. Third conveying roll 473 is power feeder 49. Power feeder 49 is disposed at an upstream side relative to first supply zone SZ1 in chamber 41. Metal foil 400 is conveyed while being supported by power feeder 49 (third conveying roll 473). Counter electrode 48 is disposed at a downstream side relative to power feeder 49 and at an upstream side relative to first supply zone SZ1.

The counter electrode may be disposed in most upstream first supply zone SZ1. The counter electrode may be further disposed in at least one of first exhaust zone EZ1, second supply zone SZ2, and second exhaust zone EZ2.

Film production device 40A includes pressing member 45. Meanwhile, these members are optionally provided. Pressing member 45 has a roll shape and supports conveyance of metal foil 400. Film production device 40A further includes voltage adjusting device 403 and AC power supply 404. Meanwhile, these members are optionally provided.

In another embodiment, pressing member 45 is a power feeder. In this case, it is preferable that third conveying roll 473 is not a power feeder. When a voltage is applied to both of adjacent members, the members may corrode due to generation of a potential difference between the members.

[II-iii-th Exemplary Embodiment]

Figure 18:
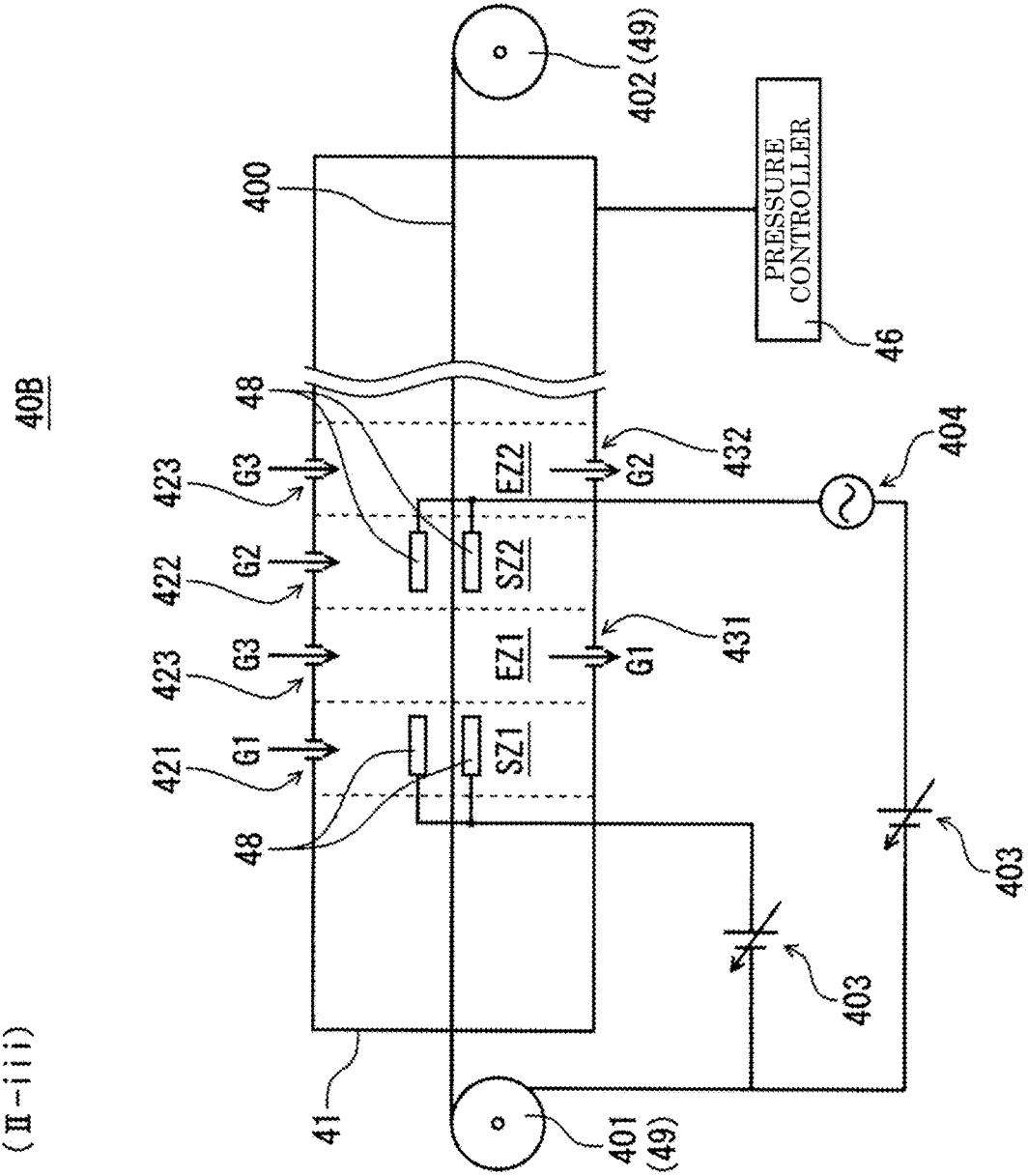
FIG. 18 is a side view conceptually illustrating still another example of the film production device according to the second and third aspects of the present invention.

FIG. 18 is a side view conceptually illustrating still another film production device according to the second and third aspects. Film production device 40B has a similar configuration to film production device 40A except for a position of a power feeder and a number and positions of counter electrodes.

Power feeder 49 is supply reel 401 and collecting reel 402, and is disposed outside chamber 41. Power feeder 49 may be any one of supply reel 401 and collecting reel 402. Two counter electrodes 48 are disposed in each of first supply zone SZ1 and second supply zone SZ2. In each zone, two counter electrodes 48 are disposed to face each other with metal foil 400 interposed therebetween.

[II-iv-th Exemplary Embodiment]

Figure 19:
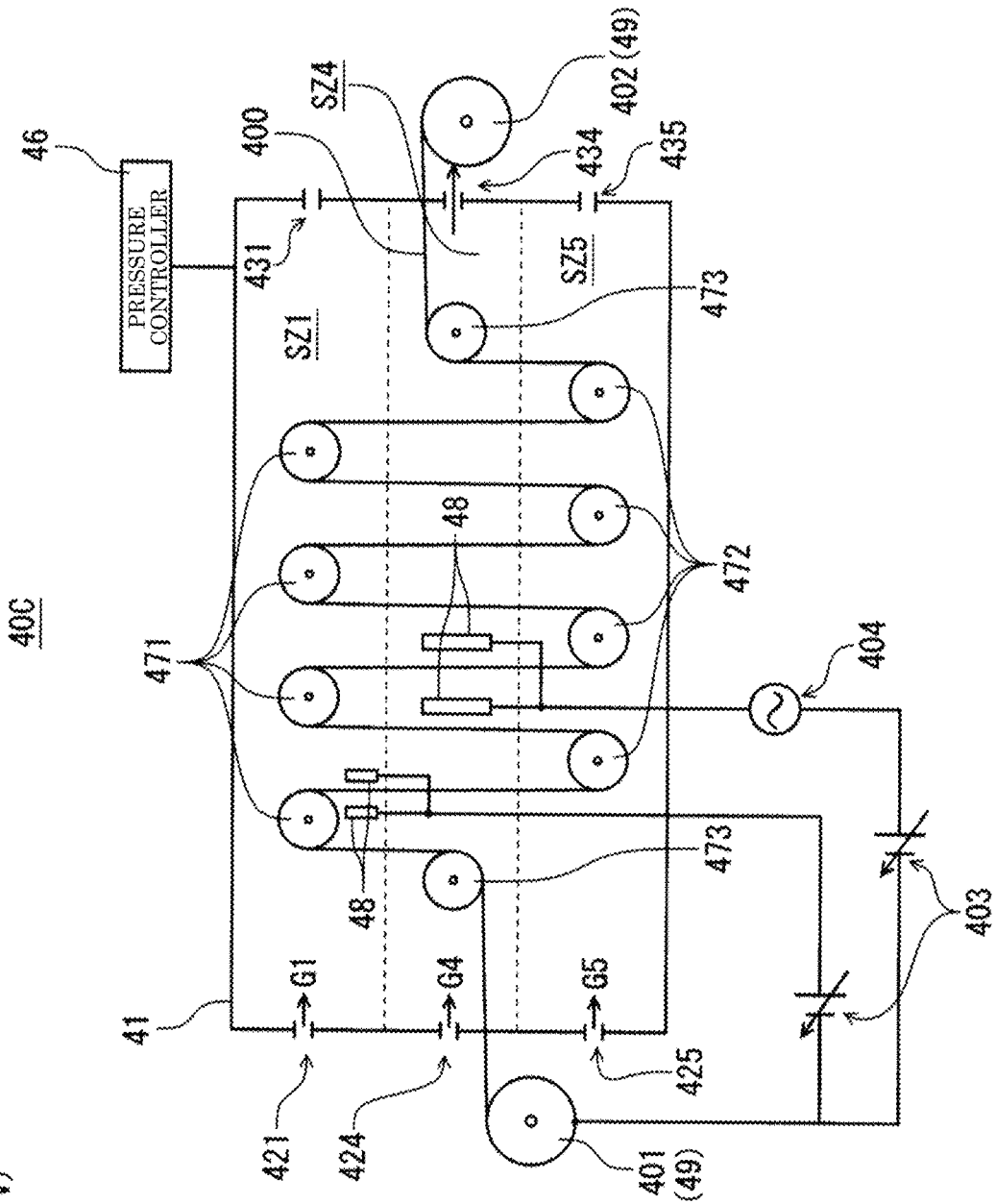
FIG. 19 is a side view conceptually illustrating still another example of the film production device according to the second and third aspects of the present invention.

FIG. 19 is a side view conceptually illustrating still another film production device according to the second and third aspects. Film production device 40C has a similar configuration to film production device 20D illustrated in FIG. 9 except that supply reel 401 and collecting reel 402 also serve as power feeder 49 and a plurality of counter electrodes 48 are provided.

That is, film production device 40C includes chamber 41. Metal foil 400 is conveyed to turn back a plurality of times in chamber 41. A number of times of turning back is not limited in particular.

Chamber 41 includes first supply port 421 for supplying first gas G1 to first supply zone SZ1, fourth supply port 424 for supplying fourth gas G4 (second gas G2 or inert gas G3) to fourth supply zone SZ4, and fifth supply port 425 for supplying fifth gas G5 (first gas G1, inert gas G3, or another first gas G1) to fifth supply zone SZ5.

In first supply zone SZ1, a plurality of first conveying rolls 471 are disposed. In fourth supply zone SZ4, a plurality of third conveying rolls 473 are disposed. In fifth supply zone SZ5, a plurality of second conveying rolls 472 are disposed.

Chamber 41 includes first exhaust port 431 for discharging first gas G1 from first supply zone SZ1, fourth exhaust port 434 for discharging fourth gas G4 from fourth supply zone SZ4, and fifth exhaust port 435 for discharging fifth gas G5 from fifth supply zone SZ5.

Power feeder 49 is supply reel 401 and collecting reel 402, and is disposed outside chamber 41. Power feeder 49 may be any one of supply reel 401 and collecting reel 402. At least one of first conveying rolls 471, second conveying rolls 472, or third conveying rolls 473 may be a power feeder.

Two counter electrodes 48 are disposed in each of first supply zone SZ1 and fourth supply zone SZ4. In each zone, two counter electrodes 48 are disposed to face each other with metal foil 400 interposed therebetween.

[II-v-th Exemplary Embodiment]

Figure 20:
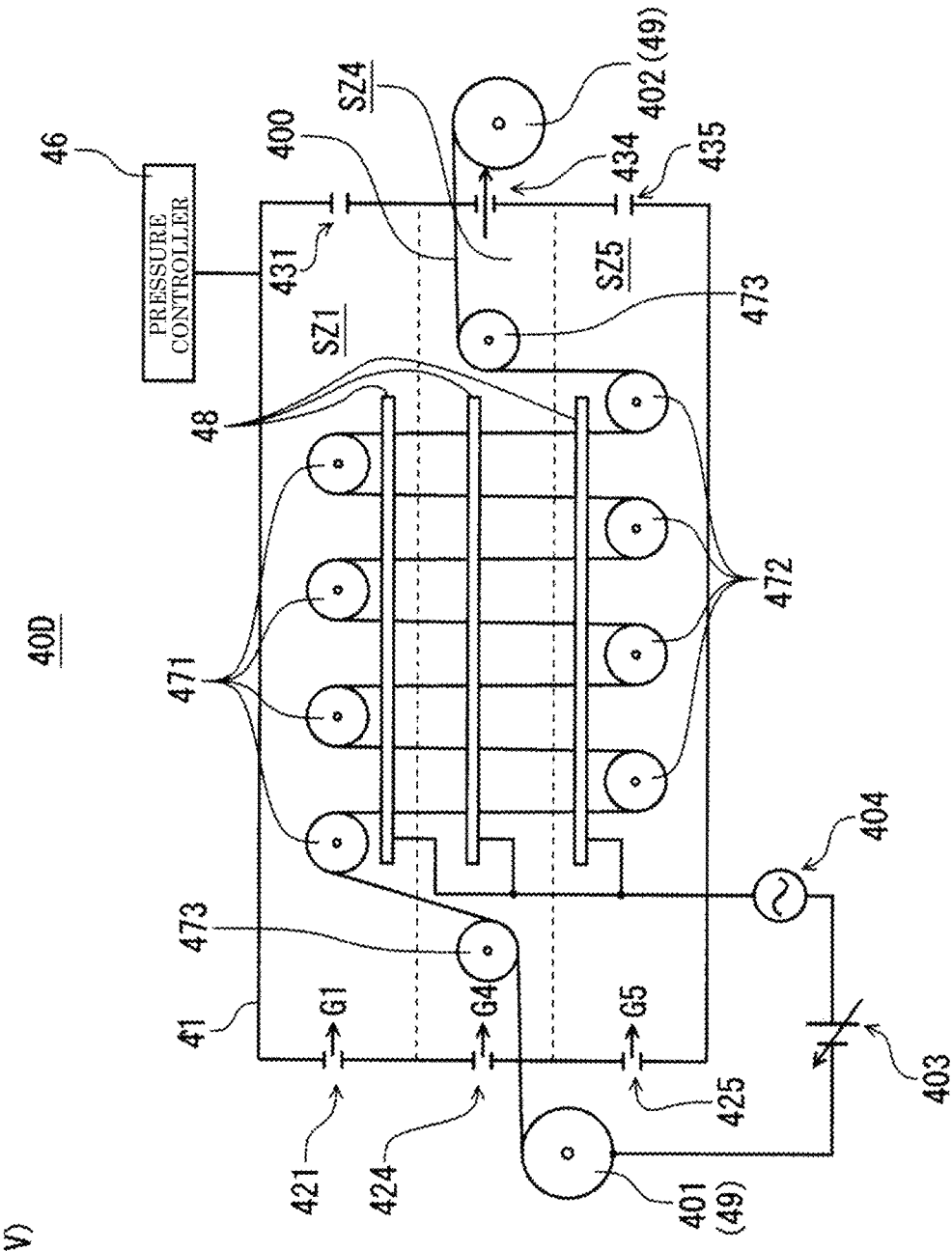
FIG. 20 is a side view conceptually illustrating still another example of the film production device according to the second and third aspects of the present invention.

FIG. 20 is a side view conceptually illustrating still another film production device according to the second and third aspects. Film production device 40D has a similar configuration to film production device 40C illustrated in FIG. 19 except for a shape and a position of counter electrode 48.

Three counter electrodes 48 are each long-sized and disposed such that a longitudinal direction of each of three counter electrodes 48 extends from supply reel 401 toward collecting reel 402 in a corresponding supply zone. Each of counter electrodes 48 has a plurality of slits (not illustrated) through which a metal foil can pass. An inner wall of the slit serves as a counter electrode. When the metal foil passes through the slit, a potential difference is generated between the inner wall and the metal foil. Counter electrodes 48 need just be disposed in any one of supply zones.

A size of counter electrode 48 is not limited in particular. Considering a degree of freedom of device design and flow of gas, it is preferable that counter electrodes 48 each have a size that does not partition chamber 41 into a plurality of chambers. The size of counter electrodes 48 is, for example, less than 80% of an area of a bottom portion of film production device 40D.

[II-vi-th Exemplary Embodiment]

Figure 21:
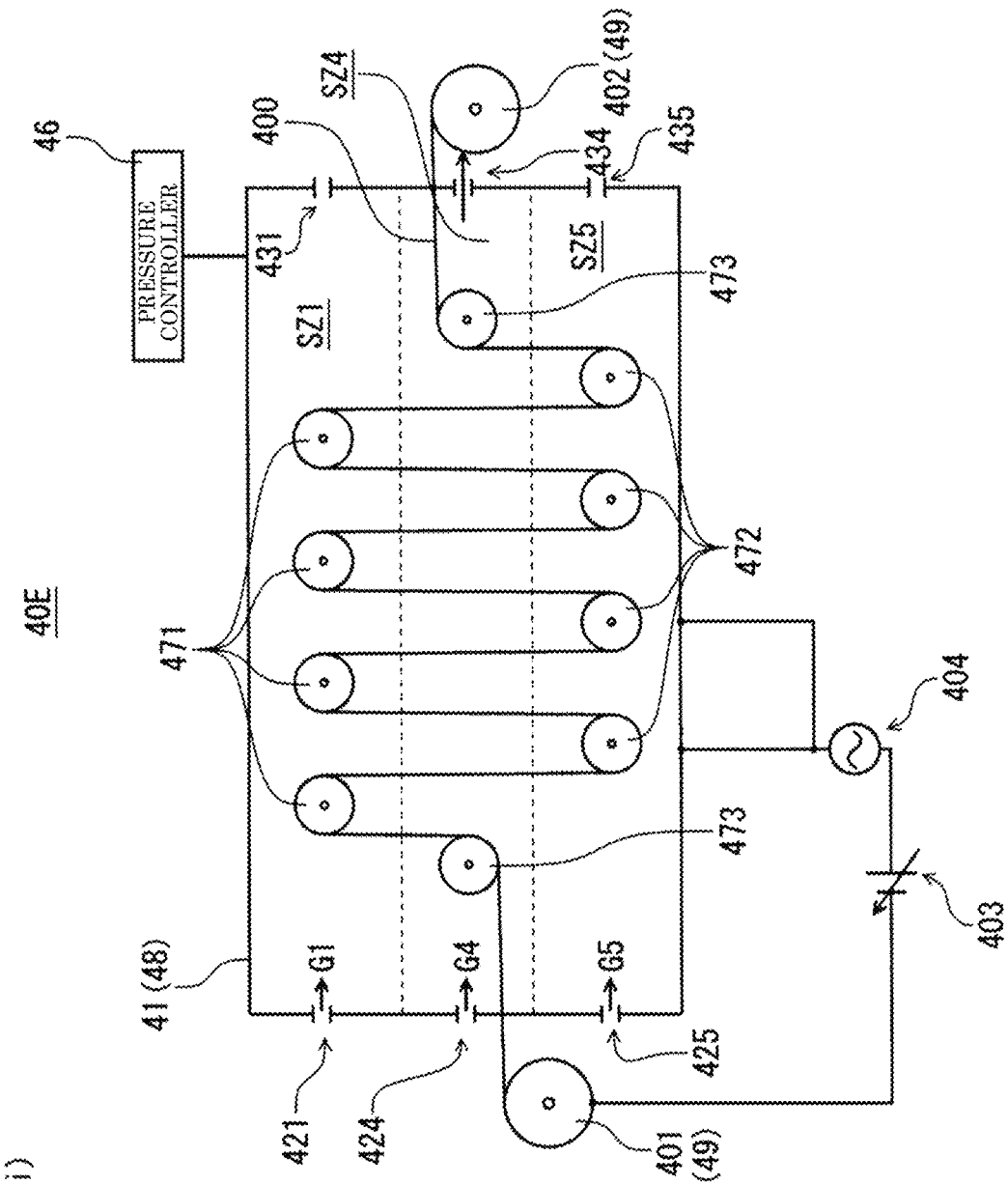
FIG. 21 is a side view conceptually illustrating still another example of the film production device according to the second and third aspects of the present invention.

FIG. 21 is a side view conceptually illustrating still another film production device according to the second and third aspects. Film production device 40E has a similar configuration to film production device 40C illustrated in FIG. 19 except that chamber 41 also serves as counter electrode 48. An inner wall of chamber 41 is electrically conductive. An arbitrary point on the inner wall is used as a contact point to generate a potential difference with metal foil 400.

IV. Fourth Aspect

In the present aspect, a metal foil is heated, and a voltage is applied to the metal foil in the presence of at least one of first gas and second gas. As a result, a uniform dielectric layer is efficiently formed.

[Film Production Method]

Figure 22:
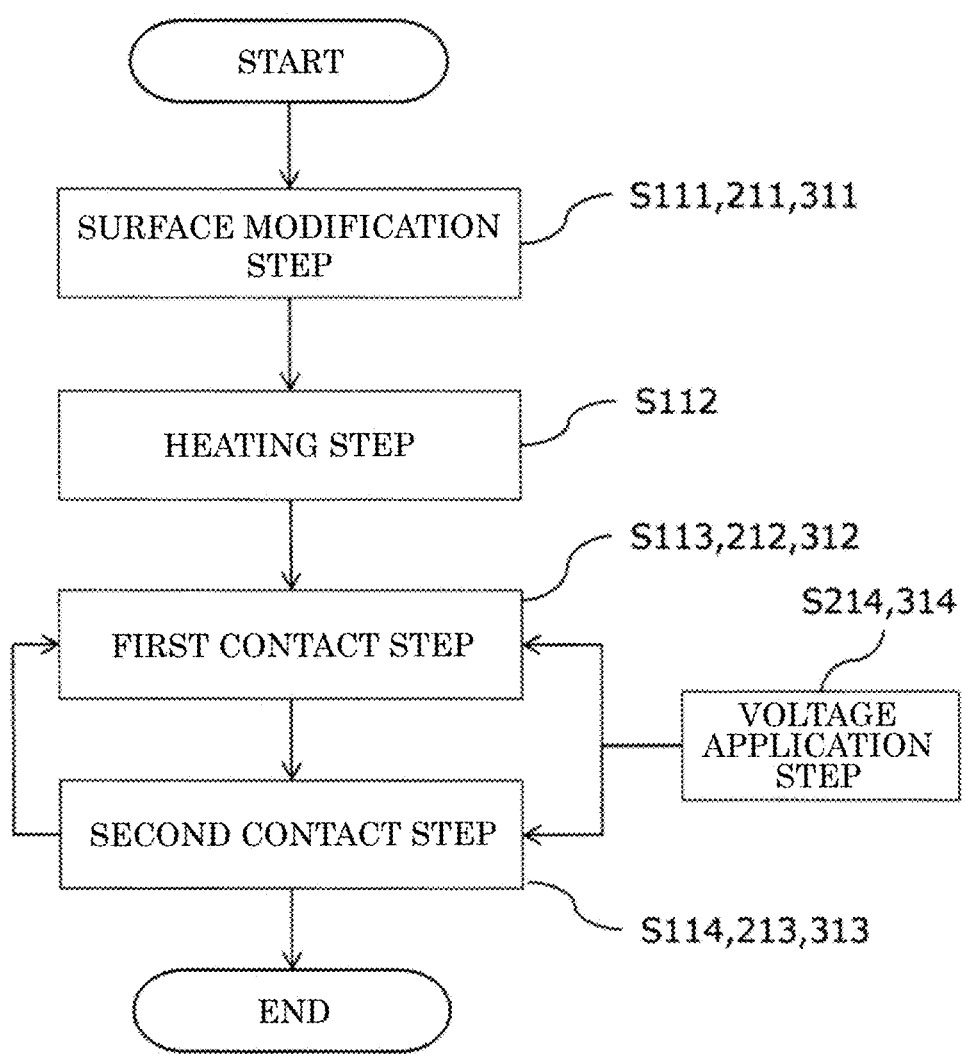
FIG. 22 is a flowchart illustrating a film production method according to a fourth aspect of the present invention.

A film production method according to the fourth aspect includes a heating step of heating a metal foil and an application step of applying a voltage to the metal foil in the presence of at least one of first gas and second gas. FIG. 22 is a flowchart illustrating the film production method according to the fourth aspect.

The heating step and the application step are performed in a similar manner to the film production methods according to the first aspect, the second aspect, and the third aspect. A first contact step may be performed while heating the metal foil to which the voltage has been applied. A second contact step may be performed while heating the metal foil to which the voltage has been applied. The metal foil may be heated by heat that is generated by a power feeder.

[Method for Producing Electrode Foil]

Figure 23:
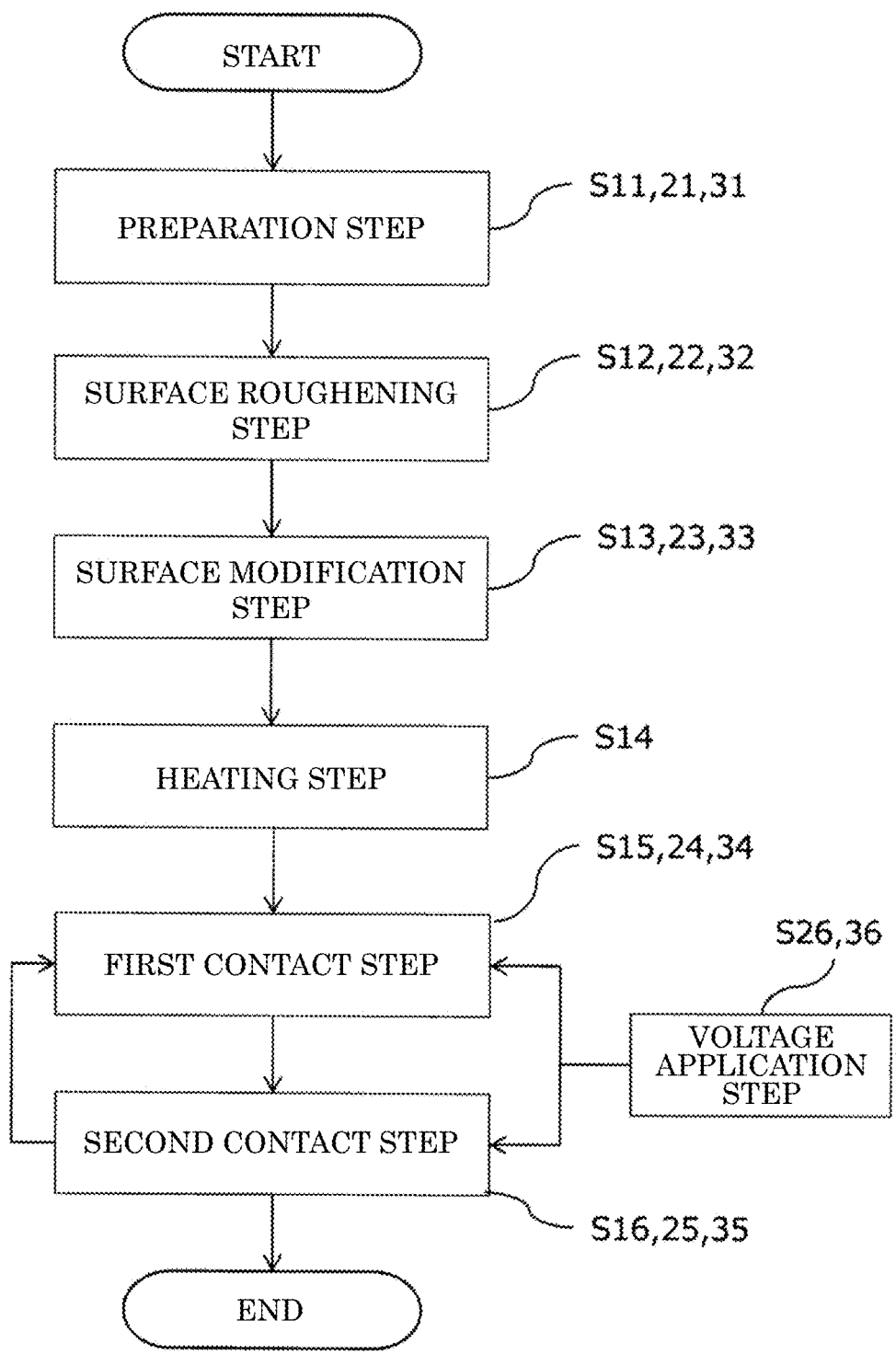
FIG. 23 is a flowchart illustrating a method for producing an electrode foil according to the fourth aspect of the present invention.

A method for producing an electrode foil according to the fourth aspect includes a heating step of heating a metal foil and an application step of applying a voltage to the metal foil in the presence of at least one of first gas and second gas. FIG. 23 is a flowchart illustrating a method for producing an electrode foil according to the fourth aspect. The heating step and the application step are performed in a similar manner to the film production methods according to the first aspect, the second aspect, and the third aspect.

[Film Production Device]

A film production device according to the fourth aspect includes a heat generator that is disposed in a chamber and heats a metal foil on which a film is to be formed by making contact with a part of the metal foil, a power feeder that makes contact with a part of the metal foil, and a counter electrode that generates a voltage difference between the metal foil and the power feeder. The first gas and the second gas are supplied to be in contact with both main surfaces of the metal foil.

The film production device according to the fourth aspect includes a chamber, a pressure controller, a supply port, and an exhaust port similar to those of the film production devices according to the first to third aspects. The film production device according to the fourth aspect further includes a heat generator similar to that of the film production device according to the first aspect, and a power feeder and a counter electrode similar to those of the film production devices according to the second and third aspects. The film production device according to the fourth aspect may include members such as the support and the pressing member in the film production devices according to the first to third aspects.

[IV-th Exemplary Embodiment]

Figure 24:
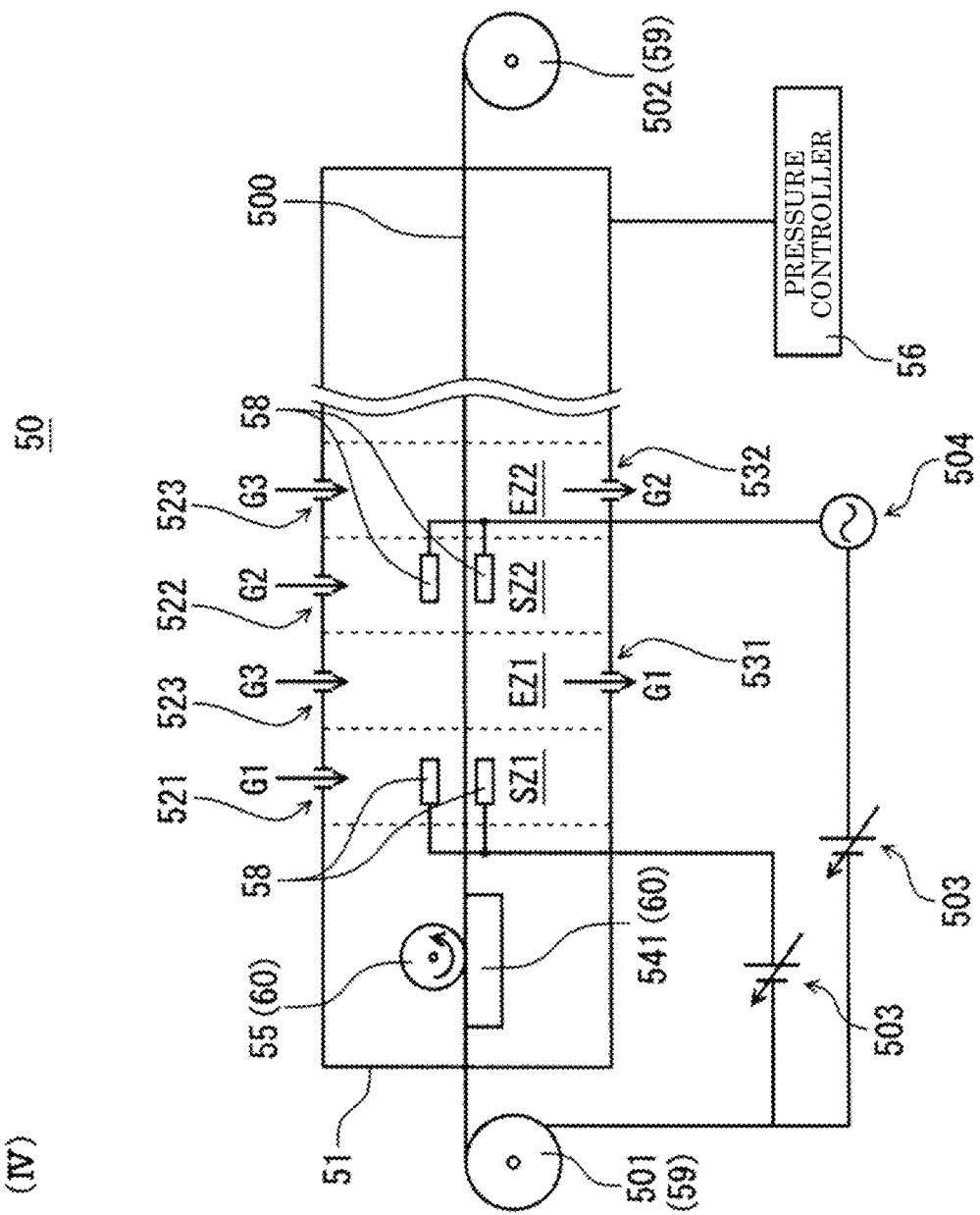
FIG. 24 is a side view conceptually illustrating an example of a film production device according to the fourth aspect of the present invention.

FIG. 24 is a side view conceptually illustrating an example of a film production device according to the fourth aspect.

Film production device 50 has a similar configuration to film production device 20A illustrated in FIG. 6 except that film production device 50 includes supply reel 501 also serving as power feeder 59 and counter electrode 58 similar to those of film production device 40B illustrated in FIG. 18.

That is, film production device 50 includes chamber 51. Chamber 51 includes first supply zone SZ1 to which first gas G1 is supplied, second supply zone SZ2 to which second gas G2 is supplied, first exhaust zone EZ1 for purging first gas G1, and second exhaust zone EZ2 for purging second gas G2. The zones are arranged in this order so as to separate chamber 51 in a direction intersecting a conveyance direction. First supply port 521, second supply port 522, third supply port 523, first exhaust port 531, and second exhaust port 532 are provided as appropriate in the zones. Purging from each exhaust port is appropriately performed. An exhaust port to be used may be determined as needed.

A pressure in chamber 51 is controlled by pressure controller 56 so as to be a reduced pressure atmosphere. Pressure controller 56 may appropriately control the pressure in each zone. Metal foil 500 is wound around supply reel 501 rotationally driven by a motor, and is supplied to chamber 51 at an upstream side while being unwound from supply reel 501. Metal foil 500 is collected by collecting reel 502 after processing. Each of supply reel 501 and collecting reel 502 is power feeder 59.

The counter electrode 58 is disposed in most upstream first supply zone SZ1. The counter electrode 58 may be further disposed in at least one of first exhaust zone EZ1, second supply zone SZ2, and second exhaust zone EZ2. Meanwhile, counter electrode 58 may be disposed at a downstream side relative to power feeder 59 and at an upstream side relative to first supply zone SZ1.

Stage 541 that supports conveyed metal foil 500 is disposed at the upstream side of chamber 51. Stage 541 is heat generator 60. Pressing member 55 for pressing metal foil 500 toward stage 541 is disposed at a position corresponding to stage 541. Pressing member 55 is also heat generator 60. Pressing member 55 has a roll shape and supports conveyance of metal foil 500.

Film production device 50 further includes voltage adjusting device 503 and AC power supply 504. Meanwhile, these members are optionally provided.

An electrode foil produced by a method according to the present invention improves capacitance and a withstand voltage and thus can be used for electrolytic capacitors for various applications.

The invention claimed is:

1. A film production method for producing a layer containing a metal oxide, the film production method comprising:
   a heating step of heating a metal foil containing a first metal by bringing a part of the metal foil into contact with at least one heat generator, the metal foil having a first main surface and a second main surface that is disposed opposite to the first main surface;
   a first contact step of letting first gas containing a second metal to be in contact with each of the first main surface and the second main surface of the metal foil in a state where the part of the metal foil is supported by the at least one heat generator; and
   a second contact step of letting second gas containing an oxidant to be in contact with each of the first main surface and the second main surface of the metal foil in a state where the part of the metal foil is supported by the at least one heat generator so that an oxide of the second metal is formed on each of the first main surface and the second main surface, wherein:
   the at least one heat generator includes a first heat generator and a second heat generator, the first heat generator being in contact with the first main surface of the metal foil, the second heat generator being in contact with the second main surface of the metal foil, and
   the part of the metal foil is supported by being sandwiched between the first heat generator and the second heat generator.

2. The film production method according to claim 1, wherein the at least one heat generator is a conveying roll.

3. The film production method according to claim 1, wherein the heating step is performed in a space of a chamber identical to that for the first contact step.

4. The film production method according to claim 1, further comprising a surface modification step of modifying each of the first main surface and the second main surface of the metal foil before the first contact step.

5. A method for producing an electrode foil, the method comprising:
   a preparation step of preparing a metal foil containing a first metal, the metal foil having a first main surface and a second main surface that is disposed opposite to the first main surface;
   a surface roughening step of roughening each of the first main surface and the second main surface of the metal foil;
   a heating step of heating the metal foil that has been roughened by bringing a part of the metal foil into contact with at least one heat generator;
   a first contact step of letting first gas containing a second metal to be in contact with each of the first main surface and the second main surface of the metal foil in a state where the part of the metal foil is supported by the at least one heat generator; and
   a second contact step of forming a dielectric layer by letting second gas containing an oxidant to be in contact with each of the first main surface and the second main surface of the metal foil in a state where the part of the metal foil is supported by the at least one heat generator so that an oxide of the second metal is formed on each of the first main surface and the second main surface, wherein:
   the at least one heat generator includes a first heat generator and a second heat generator, the first heat generator being in contact with the first main surface of the metal foil, the second heat generator being in contact with the second main surface of the metal foil, and
   the part of the metal foil is supported by being sandwiched between the first heat generator and the second heat generator.

6. The method according to claim 5, wherein the at least one heat generator is a conveying roll.

7. A film production method for producing a layer containing a metal oxide, comprising:
   a preparation step of preparing a metal foil containing a first metal, the metal foil having a first main surface and a second main surface that is disposed opposite to the first main surface;
   a first contact step of letting first gas containing a second metal to be in contact with each of the first main surface and the second main surface of the metal foil; and
   a second contact step of letting second gas containing an oxidant to be in contact with each of the first main surface and the second main surface of the metal foil so that an oxide of the second metal is formed on each of the first main surface and the second main surface,
   wherein the first contact step includes a first application step of applying a voltage to the metal foil in the presence of the first gas by bringing a part of the metal foil into contact with at least one first power feeder.

8. The film production method according to claim 7, wherein in the first contact step, the part of the metal foil is supported by the at least one first power feeder.

9. The film production method according to claim 7, wherein the at least one first power feeder is a conveying roll.

10. The film production method according to claim 7, wherein in the first application step, the metal foil is brought into contact with two or more first power feeders that include the at least one first power feeder.

11. The film production method according to claim 7, wherein the second contact step includes a second application step of applying a voltage to the metal foil in the presence of the second gas by bringing a part of the metal foil into contact with at least one second power feeder.

12. The film production method according to claim 11, wherein in the second contact step, the part of the metal foil is supported by the at least one second power feeder.

13. The film production method according to claim 11, wherein the at least one second power feeder is a conveying roll.

14. The film production method according to claim 11, wherein in the second application step, the metal foil is brought into contact with the two or more second power feeders that include the at least one second power feeder.

15. The film production method according to claim 7, wherein each of the first main surface and the second main surface of the metal foil is roughened.

16. The film production method according to claim 7, further comprising a surface modification step of modifying each of the first main surface and the second main surface of the metal foil before the first contact step.

17. A method for producing an electrode foil, the method comprising:
   a preparation step of preparing a metal foil containing a first metal, the metal foil having a first main surface and a second main surface that is disposed opposite to the first main surface;
   a surface roughening step of roughening each of the first main surface and the second main surface of the metal foil;

a first contact step of letting first gas containing a second metal to be in contact with the each of the first main surface and the second main surface of the metal foil that has been roughened;

a second contact step of letting second gas containing an oxidant to be in contact with the each of the first main surface and the second main surface of the metal foil so that an oxide of the second metal is formed on each of the first main surface and the second main surface of the metal foil, wherein the first contact step includes a first application step of applying a voltage to the metal foil in the presence of the first gas by bringing a part of the metal foil into contact with at least one first power feeder.

18. The method according to claim 17, wherein in the first contact step, the part of the metal foil is supported by the at least one first power feeder.

19. The method according to claim 17, wherein the at least one first power feeder is a conveying roll.

20. The method according to claim 17, wherein in the first application step, the metal foil is brought into contact with two or more first power feeders that include the at least one first power feeder.

21. The method according to claim 17, wherein the first application step is performed in a space of a chamber identical to that for the first contact step.

22. The method according to claim 17, wherein the second contact step includes a second application step of applying a voltage to the metal foil in the presence of the second gas by bringing a part of the metal foil into contact with at least one second power feeder.

23. The method according to claim 22, wherein in the second contact step, the part of the metal foil is supported by the at least one second power feeder.

24. The method according to claim 22, wherein the at least one second power feeder is a conveying roll.

25. The method according to claim 22, wherein in the second application step, the metal foil is brought into contact with two or more second power feeders that include the at least one second power feeder.

26. The method according to claim 22, wherein the second application step is performed in a space of a chamber identical to that for the second contact step.

27. The method according to claim 17, further comprising a surface modification step of modifying each of the first main surface and the second main surface of the metal foil before the first contact step.

28. A film production method for producing a layer containing a metal oxide, comprising:

a preparation step of preparing a metal foil containing a first metal, the metal foil having a first main surface and a second main surface that is disposed opposite to the first main surface;

a first contact step of letting first gas containing a second metal to be in contact with each of the first main surface and the second main surface of the metal foil;

a second contact step of letting second gas containing an oxidant to be in contact with each of the first main surface and the second main surface of the metal foil so that an oxide of the second metal is formed on each of the first main surface and the second main surface, wherein the second contact step includes an application step of applying a voltage to the metal foil in the presence of the second gas by bringing a part of the metal foil into contact with at least one power feeder.

29. The film production method according to claim 28, wherein in the second contact step, the part of the metal foil is supported by the at least one power feeder.

30. The film production method according to claim 28, wherein the at least one power feeder is a conveying roll.

31. The film production method according to claim 28, wherein each of the first main surface and the second main surface of the metal foil is roughened.

32. The film production method according to claim 28, wherein in the application step, the metal foil is brought into contact with the two or more power feeders that include the at least one power feeder.

33. The film production method according to claim 28, further comprising a surface modification step of modifying each of the first main surface and the second main surface of the metal foil before the first contact step.

34. A method for producing an electrode foil, the method comprising:

a preparation step of preparing a metal foil containing a first metal, the metal foil having a first main surface and a second main surface that is disposed opposite to the first main surface;

a roughening step of roughening each of the first main surface and the second main surface of the metal foil;

a first contact step of letting first gas containing a second metal to be in contact with each of the first main surface and the second main surface of the metal foil that has been roughened;

a second contact step of letting second gas containing an oxidant to be in contact with each of the first main surface and the second main surface of the metal foil so that an oxide of the second metal is formed on each of the first main surface and the second main surface, wherein the second contact step includes an application step of applying a voltage to the metal foil in the presence of the second gas by bringing a part of the metal foil into contact with at least one power feeder.

35. The method according to claim 34, wherein in the second contact step, the part of the metal foil is supported by the at least one power feeder.

36. The method according to claim 34, wherein the at least one power feeder is a conveying roll.

37. The method according to claim 34, wherein in the application step, the metal foil is brought into contact with two or more second power feeders that include the at least one power feeder.

38. The method according to claim 34, further comprising a surface modification step of modifying each of the first main surface and the second main surface of the metal foil before the first contact step.

39. A film production method for producing a layer containing a metal oxide, comprising:

a preparation step of preparing a metal foil containing a first metal, the metal foil having a first main surface and a second main surface that is disposed opposite to the first main surface;

a heating step of heating the metal foil by bringing a part of the metal foil into contact with at least one heat generator;

a first contact step of letting first gas containing a second metal to be in contact with each of the first main surface and the second main surface of the metal foil in a state where the part of the metal foil is supported by the at least one heat generator;

a second contact step of letting second gas containing an oxidant to be in contact with each of the first main surface and the second main surface of the metal foil in a state where the part of the metal foil is supported by the at least one heat generator so that an oxide of the second metal is formed on each of the first main surface and the second main surface, wherein:

the first contact step includes a first application step of applying a voltage to the metal foil in the presence of the first gas by bringing a part of the metal foil into contact with at least one first power feeder, and the second contact step includes a second application step of applying a voltage to the metal foil in the presence of the second gas by bringing a part of the metal foil into contact with at least one second power feeder.

* * * * *